United States Patent
Chouaib et al.

(10) Patent No.: US 12,379,672 B2
(45) Date of Patent: Aug. 5, 2025

(54) METROLOGY OF NANOSHEET SURFACE ROUGHNESS AND PROFILE

(71) Applicant: KLA Corporation, Milpitas, CA (US)

(72) Inventors: Houssam Chouaib, San Jose, CA (US); Haomiao Chang, Milpitas, CA (US); Teng Gu, Milpitas, CA (US); Tianrong Zhan, Milpitas, CA (US); Andrew Lagodzinski, Milpitas, CA (US); Zhengquan Tan, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 167 days.

(21) Appl. No.: 18/196,219

(22) Filed: May 11, 2023

(65) Prior Publication Data

US 2024/0377758 A1    Nov. 14, 2024

(51) Int. Cl.
*G03F 7/00*    (2006.01)

(52) U.S. Cl.
CPC .... *G03F 7/706841* (2023.05); *G03F 7/70655* (2023.05)

(58) Field of Classification Search
CPC ........... G03F 7/706841; G03F 7/70655; G03F 7/70625
USPC ....................................................... 430/322
See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |
| 6,429,943 B1 | 8/2002 | Opsal et al. |
| 7,478,019 B2 | 1/2009 | Zangooie et al. |
| 7,933,026 B2 | 4/2011 | Opsal et al. |
| 9,291,554 B2 | 3/2016 | Kuznetsov et al. |
| 9,405,290 B1 | 8/2016 | Malkova et al. |
| 9,581,430 B2 | 2/2017 | Manassen et al. |
| 9,739,702 B2 | 8/2017 | Bringoltz et al. |
| 9,915,522 B1 | 3/2018 | Jiang et al. |
| 10,458,912 B2 | 10/2019 | Chouaib et al. |
| 10,591,406 B2 | 3/2020 | Bringoltz et al. |
| 10,769,320 B2 | 9/2020 | Kuznetsov et al. |
| 10,794,839 B2 | 10/2020 | Rosenberg et al. |
| 11,036,898 B2 | 6/2021 | Chouaib et al. |
| 11,156,548 B2 | 10/2021 | Nguyen et al. |

(Continued)

FOREIGN PATENT DOCUMENTS

| | | |
|---|---|---|
| CN | 101881599 A | 11/2010 |
| CN | 104482878 A | 4/2015 |

OTHER PUBLICATIONS

Afanas et al., "Internal photoemission at interfaces of high-k insulators with semiconductors and metals", J. Appl. Phys. 102, 081301 (2007).

(Continued)

*Primary Examiner* — Caleen O Sullivan
(74) *Attorney, Agent, or Firm* — Suiter Swantz IP

(57) ABSTRACT

An inspection system includes a controller including a memory maintaining program instructions and one or more processors configured to execute the program instructions. The program instructions cause the one or more processors to generate a geometric model of a structure of a sample, generate an optical response function model of the structure of the sample to illumination based at least in part on the geometric model, receive measured data from a detector, generate a parametric sub-structure model based on at least the optical response function model and the measured data, and extract one or more parameters of the structure based on the measured data.

40 Claims, 12 Drawing Sheets

(56) References Cited

U.S. PATENT DOCUMENTS

| | | |
|---|---|---|
| 11,378,451 B2 | 7/2022 | Wang et al. |
| 11,555,689 B2 | 1/2023 | Chouaib et al. |
| 11,573,077 B2 | 2/2023 | Chouaib et al. |
| 2014/0019097 A1 | 1/2014 | Bakeman et al. |
| 2014/0297211 A1 | 10/2014 | Pandev et al. |
| 2014/0316730 A1 | 10/2014 | Shchegrov et al. |
| 2015/0046118 A1 | 2/2015 | Pandev et al. |
| 2016/0109375 A1 | 4/2016 | Pandev et al. |
| 2016/0139032 A1 | 5/2016 | Rampoldi et al. |
| 2016/0141193 A1 | 5/2016 | Pandev et al. |
| 2016/0282105 A1 | 9/2016 | Pandev |
| 2017/0307548 A1 | 10/2017 | Bykanov et al. |

OTHER PUBLICATIONS

Chouaib et al., "Rapid photoreflectance spectroscopy for strained silicon metrology." Review of Scientific Instruments 79.10, 103106 (2008).

Ferlauto et al., "Analytical model for the optical functions of amorphous semiconductors from the near-infrared to ultraviolet: Application in thin film photovoltaics," J. Appl. Phys. 92, 2424 (2002).

Nguyen et al., "Optical properties of Jet-Vapor-Deposited TiAlO and HfAlO determined by Vacuum Ultraviolet Spectroscopic Ellipsometry," AIP Conf. Proc. 683, 181 (2003).

Nguyen et al., "Sub-bandgap defect states in polycrystalline hafnium oxide and their suppression by admixture of silicon," APL 87, 192903 (2005).

Price et al., "Identification of interfacial defects in high-k gate stack films by spectroscopic ellipsometry," J. Vac. Sci. Technol. B 27 (1), 310 (2009).

Price et al., "Identification of sub-band-gap absorption features at the HfO2/Si(100) interface via spectroscopic ellipsometry," APL 91, 061925 (2007).

Sato et al., "Carrier Density Dependence of Optical Band Gap and Work Function in Sn-Doped In2O3 Films," Appl. Phys. Express 3 (2010).

Schlaf et al., "Work function measurements on Indium Tin Oxide films," J. of Electron Spectr. And Related Phenomena 120, 149 (201).

Zhang et al., "Tunnel field effect transistor heterojunction band alignment by internal photoemission spectroscopy", Appl. Phys. Lett. 100, 102104 (2012).

Korean Intellectual Property Office, International Search Report and Written Opinion received in International Application No. PCT/US2024/028692, Aug. 20, 2024, 6 pages.

METROLOGY OF NANOSHEET SURFACE ROUGHNESS AND PROFILE

TECHNICAL FIELD

The present disclosure relates generally to spectroscopic metrology, and more particularly, to spectroscopic metrology of nanosheets.

BACKGROUND

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Minimizing the total time from detecting a yield problem to fixing it determines the return-on-investment for a semiconductor manufacturer.

Metrology may be used during semiconductor manufacturing to take various measurements of, for example, a semiconductor wafer or reticle. Metrology tools can be used to measure structural and material characteristics associated with various semiconductor fabrication processes. For example, the metrology tools can measure material composition or can measure dimensional characteristics of structures and films such as film thickness, critical dimension (CD) of structures, or overlay. These measurements are used to facilitate process controls and/or yield efficiencies during the manufacture of semiconductor dies.

As semiconductor device pattern dimensions continue to shrink, smaller metrology targets are often required. Furthermore, the requirements for measurement accuracy and matching to actual device characteristics increase the need for device-like targets as well as in-die and even on-device measurements. Therefore, it would be advantageous to provide a device, system, and method that cures the shortcomings described above.

SUMMARY

An inspection system is described, in accordance with one or more embodiments of the present disclosure. The inspection system includes a controller. The controller includes a memory maintaining program instructions. The controller includes one or more processors configured to execute the program instructions. The program instructions cause the one or more processors to generate a geometric model of a structure of a sample. The structure comprises a nanosheet profile with a surface roughness. The geometric model approximates the surface roughness. The program instructions cause the one or more processors to generate an optical response function model of the structure of the sample to illumination based at least in part on the geometric model. The optical response function model simulates an optical response of the nanosheet profile with the surface roughness to the illumination. The program instructions cause the one or more processors to receive measured data from a detector. The measured data comprises a measured spectra of the structure detected by the detector. The program instructions cause the one or more processors to generate a parametric sub-structure model based on at least the optical response function model and the measured data. The program instructions cause the one or more processors to extract one or more parameters of the structure based on the measured data.

In some embodiments, the geometric model approximates the surface roughness of the nanosheet profile by representing the nanosheet profile as a homogenous layer and a roughness layer. The roughness layer is a wrapper around the homogenous layer.

In some embodiments, the one or more parameters comprise a standard deviation of the surface roughness.

In some embodiments, the homogenous layer comprises a material. The homogenous layer comprises one or more dispersion parameters associated with the material; wherein the one or more dispersion parameters comprise a refractive index (n) and an extinction coefficient (k).

In some embodiments, the roughness layer comprises one or more dispersion parameters determined using an effective medium approximation. The one or more dispersion parameters comprise a refractive index (n) and an extinction coefficient (k).

In some embodiments, the roughness layer is a mixture of first material and a second material in a ratio; wherein the first material is different than the second material.

In some embodiments, the ratio is a fixed ratio.

In some embodiments, the program instructions cause the one or more processors to float the ratio.

In some embodiments, the roughness layer is isotropic; wherein the surface roughness is anisotropic.

In some embodiments, the geometric model approximates the surface roughness by a building block. A height of the building block varies along a direction.

In some embodiments, the height of the building block is defined by a plurality of segments.

In some embodiments, the plurality of segments each comprise a segment height at a critical dimension along the direction.

In some embodiments, the segment height is defined as one of a fixed segment height or a percentage segment height.

In some embodiments, the critical dimension is defined as one of a fixed critical dimension or a percentage critical dimension from an edge.

In some embodiments, the plurality of segments are slabs; wherein the building block comprises a stepped-shape.

In some embodiments, the program instructions cause the one or more processors to adjust a resolution of the height of the building block by adjusting a quantity of the plurality of segments.

In some embodiments, the height of the building block is defined by one or more polynomial functions.

In some embodiments, the nanosheet profile comprises a first surface and a second surface. The first surface is opposite to the second surface; wherein the first surface is defined by a first polynomial function. The second surface is defined by a second polynomial function. The height of the building block is defined by the first polynomial function and the second polynomial function.

In some embodiments, the first polynomial function is different than the second polynomial function.

In some embodiments, the one or more parameters comprise a roughness amplitude and a correlation length.

In some embodiments, the one or more parameters comprise a height profile at a plurality of locations along the direction.

In some embodiments, the inspection system comprises a user input source. The program instructions cause the one or more processors to receive user input from the user input source. The one or more processors generate the geometric model based at least in part on the user input.

In some embodiments, the inspection system comprises an optical imaging sub-system. The optical imaging sub-system comprises an illumination source and the detector. The illumination source generates the illumination. The detector is communicatively coupled to the controller.

In some embodiments, the optical imaging sub-system comprises at least one of a spectroscopic ellipsometer, a reflectometer, a small-angle x-ray scatterometer, a scanning electron microscope, or a transmission electron microscope.

In some embodiments, the nanosheet profile comprises at least one of a diamond cross-section, an elliptical cross-section, a triangular cross-section, a rectangular cross-section, or a trapezoidal cross-section.

In some embodiments, the structure is a gate-all-around (GAA) transistor.

In some embodiments, the nanosheet profile comprises a thickness of 5 nanometers or below.

In some embodiments, the program instructions cause the one or more processors to generate the optical response function model using a rigorous coupled wave analysis (RCWA).

In some embodiments, the parametric sub-structure model is a neural network model trained using the optical response function model and the measured data.

A method is described, in accordance with one or more embodiments of the present disclosure. The method includes generating a geometric model of a structure of a sample. The structure comprises a nanosheet profile with a surface roughness. The geometric model approximates the surface roughness. The method includes generating an optical response function model of the structure of the sample to illumination based at least in part on the geometric model. The optical response function model simulates an optical response of the nanosheet profile with the surface roughness to the illumination. The method includes receiving measured data from a detector. The measured data comprises a measured spectra of the structure detected by the detector. The method includes generating a parametric sub-structure model based on at least the optical response function model and the measured data. The method includes extracting one or more parameters of the structure based on the measured data.

In some embodiments, the geometric model approximates the surface roughness by representing the nanosheet profile as a homogenous layer and a roughness layer. The roughness layer is a wrapper around the homogenous layer.

In some embodiments, the roughness layer comprises one or more dispersion parameters determined using an effective medium approximation. The one or more dispersion parameters comprise a refractive index (n) and an extinction coefficient (k).

In some embodiments, the roughness layer is a mixture of first material and a second material in a ratio. The first material is different than the second material.

In some embodiments, the roughness layer is isotropic. The surface roughness is anisotropic.

In some embodiments, the geometric model approximates the surface roughness by a building block. A height of the building block varies along a direction.

In some embodiments, the height of the building block is defined by a plurality of segments. The plurality of segments each comprise a segment height at a critical dimension along the direction.

In some embodiments, the segment height is defined as one of a fixed segment height or a percentage segment height. The critical dimension is defined as one of a fixed critical dimension or a percentage critical dimension from an edge.

In some embodiments, the height of the building block is defined by one or more polynomial functions.

In some embodiments, the nanosheet profile comprises a first surface and a second surface. The first surface is opposite to the second surface. The first surface is defined by a first polynomial function. The second surface is defined by a second polynomial function. The height of the building block is defined by the first polynomial function and the second polynomial function.

In some embodiments, the one or more parameters comprise at least one of standard deviation of the surface roughness, a roughness amplitude and a correlation length, a height profile.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
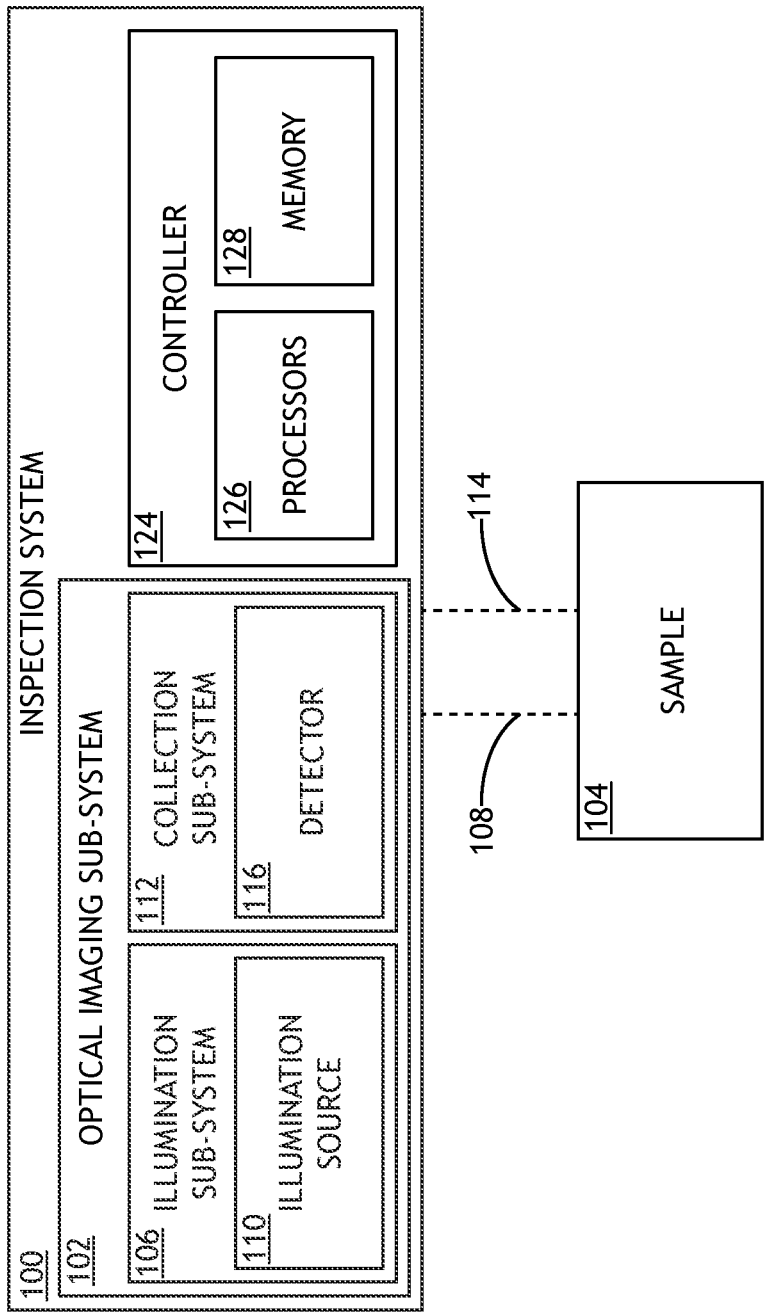
FIG. 1A illustrates a block diagram of an inspection system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the present disclosure.

As the target structures of the next generation of thin FinFETs or gate-all-around FETs become more sophisticated in their designs of both composite materials and geometries (such as size, shape, material interface, etc.), current approaches are not able to accommodate all the necessary measurement steps to ensure high measure quality, and consequently to ensure high yields.

Nanostructures may include surface roughness. The surface roughness may introduce anisotropy in the nanostructure. In the gate-all-around (GAA) semiconductor manufacturing process, the nanosheet surface roughness is of great concern for the final device performance. With the nanosheet thickness narrowed down to sub-5 nm and the gate length approaching the 10 nm, the atomic intrinsic scale variation due to surface roughness must be monitored, controlled, and minimized for its large impact on performance variation from one nanosheet to another.

Methods for nano-scale surface topography of surface roughness include Transmission Electron Microscope (TEM) and Atomic Force Microscopy (AFM). However, TEM and AFM include a number of disadvantages. TEM is a destructive technique. TEM is inadequate for inline metrology. TEM requires the preparation of a surface-preserving cross-section and the deposition of a thin-film material like applying a coating on the surface. Sample preparations from GAA wafers are very time-consuming. TEM requires image analysis to extract the roughness parameters. TEM does not ensure preservation of original surface. In other words, the measurement itself modifies the target parameter. TEM may generate potential inaccuracies and artifacts due to sample preparations prior to the measurement. Similarly, AFM is destructive and can damage the sample. AFM is a contact-mode measurement. The sample may suffer degradation from tip contact by the AFM. The scanning speed scanning speed of AFM is another limitation. AFM requires several minutes for a typical scan such that AFM is considered Ultra-low throughput. AFM may introduce artifacts unless high quality tip is utilized. AFM may also introduce image distortions due to lateral forces. AFM may experience difficulty in probing steep walls, side walls, overhangs, and the like. AFM is also inadequate for any inline measurement.

Metrology techniques such as spectroscopy or scatterometry based metrology provide an alternative method for nano-scale surface topography. The metrology techniques characterize parameters of a semiconductor wafer during a manufacturing process. In practice, light is directed onto a periodic grating formed in a semiconductor wafer. Spectra of reflected light is measured and analyzed to characterize the grating parameters. Various parameters, such as critical dimensions (CDs), thin film thicknesses, optical properties and compositions, overlay, lithography focus/dose, and the like may be determined. The various parameters typically require a geometric model of the underlying structure to be measured.

The metrology techniques require significant pre-knowledge of the periodic structure in question. The roughness of any kind is a potential source of error or uncertainty for the measurement. The roughness is a source of error for a periodic structure and is a parameter of interest. The nanosheet roughness leads to a three-dimensional nanosheet nature with no periodicity. Consequently, solving the Maxwell's equations by considering the random rough surfaces become significantly challenging. Therefore, an approximate method is preferred.

Optical scatterometry measurement data is sensitive to both the geometric features of the measured transistor structures and the optical properties of the underlying materials. The geometric features of the measured transistor structures include the surface roughness. The effect of the surface roughness may be decorrelated from other contributors, such as the optical properties and material properties of other structures captured in the measurement.

A method includes the design and implementation of flexible surface shape of nanosheet model that can measure the sheet specific roughness in GAA. The flexible surface shape model, also called surface shape building block is an innovative and advanced rigorous coupled wave (RCWA) model. Combined with the appropriate inference technology and a machine learning (ML) algorithm, the present method has demonstrated accurate and robust measurement of nano scale surface roughness.

Methods and systems for generating measurement models with flexible surface shapes of nanosheets are presented herein. The flexible surface shapes of nanosheets enable measurement model generation that is substantially simpler, less error prone, and more accurate. As a result, time to useful measurement results is significantly reduced, particularly when modelling nanosheet structures. The flexible surface shapes of nanosheets are useful for generating measurement models for metrology systems. The metrology systems employing the measurement models are then configured to measure structural and material characteristics (e.g., material composition, dimensional characteristics of structures and films, etc.) associated with the nanosheets.

Nanosheet surface profile must be monitored, controlled, and minimized for its large impact on performance variation from one nanosheet to another. Actual nanosheet profile includes a sheet height which is nonuniform. The ability to control individual height at different lateral segment in 1 single nanosheet building block is needed to measure sheet surface roughness in an Optical Critical Dimension (CD) Rigorous Coupled Wave (RCWA) model. An RCWA modeling building block is described with a physics assisted machine learning method to enable nanosheet surface roughness measurement for foundry inline process.

A metrology solution is described for determining nanosheet roughness and profile. The metrology solution is non-destructive, relatively fast, and introduces few artifacts. Specifically designed optical methods equipped with the adequate algorithms and methods, such as scatterometry can be potential candidates for their speed advantage, allowing higher sampling rate, contactless mode, non-destructiveness, and avoiding damage to the wafer. A controller extracts the nanosheet surface roughness and the nanosheet surface profile accurately from a spectroscopic optical response.

The metrology solution includes a method and model using an EMA approach, an algorithm, a set of an RCWA flexible building blocks, and/or a method and model. The metrology solution may be designed to address different process metrology requirements including, but not limited to, nanosheet roughness (t standard deviation), nanosheet roughness amplitude ($\delta$) and correlation length ($\Gamma$), and/or a nanosheet continuous height profile. Any of the metrology requirements may be selected depending on the applications and the use cases.

The nanosheet approximation can be modeled as anisotropic or isotropic. An isotropic EMA may model the interfacial roughness in the ellipsometry measurements. The EMA can be extended to more accurate and generalized anisotropic model since this type of roughness has a preferred orientation. The preferred orientation may be due to a silicon-germanium (SiGe) wet etch. In some embodiments, the isotropic EMA includes representing the nanosheet in two layers (e.g., a roughness layer and a homogenous layer). Alternatively, an anisotropic approximation may model the interfacial roughness in the ellipsometry measurements. The anisotropic approximation may be desirable due to higher levels of accuracy. In some embodiments, the anisotropic approximation includes representing the nanosheet in one or more segments. In some embodiments, the anisotropic approximation includes representing surfaces of the nanosheet using polynomial equations.

U.S. Pat. No. 10,458,912, titled "Model based optical measurements of semiconductor structures with anisotropic dielectric permittivity"; U.S. Pat. No. 11,573,077, titled "Scatterometry based methods and systems for measurement of strain in semiconductor structures"; U.S. Pat. No. 11,036,898, titled "Measurement models of nanowire semiconductor structures based on re-useable sub-structures"; U.S. Pat. No. 11,555,689, titled "Measuring thin films on grating and bandgap on grating"; U.S. Pat. No. 11,156,548, titled "Measurement methodology of advanced nanostructures"; U.S. Pat. No. 10,794,839, titled "Visualization of three-dimensional semiconductor structures"; U.S. Pat. Pub. No. 2014/0297211, titled "Statistical model-based metrology"; U.S. Pat. Pub. No. 2015/0046118, titled "Differential methods and apparatus for metrology of semiconductor targets"; U.S. Pat. Pub. No. 2016/0109375, titled "Measurement Of Small Box Size Targets"; U.S. Pat. Pub. No. 2016/0141193, titled "System, method and computer program product for combining raw data from multiple metrology tools"; U.S. Pat. Pub. No. 2016/0282105, titled "Model-Based Single Parameter Measurement"; U.S. Pat. Pub. No. 2014/0316730, titled "On-device metrology"; U.S. Pat. Pub. No. 2015/0046118, titled "Differential methods and apparatus for metrology of semiconductor targets"; U.S. Pat. No. 11,378,451, titled "Bandgap measurements of patterned film stacks using spectroscopic metrology"; U.S. Pat. No. 11,156,548, titled "Measurement methodology of advanced nanostructures; are each incorporated herein by reference in the entirety.

Referring now to FIGS. 1A-6, systems and methods for optical inspection are described in greater detail, in accordance with one or more embodiments of the present disclosure.

FIG. 1A is a block diagram of an inspection system 100, in accordance with one or more embodiments of the present disclosure. In the field of semiconductor metrology, the inspection system 100 may include an optical imaging sub-system 102. The optical imaging sub-system 102 includes an illumination sub-system 106 which illuminates a target and a collection sub-system 112 which captures relevant information provided by the interaction (or lack thereof) of the illumination sub-system 106 with a target, device or feature. The inspection system 100 also includes a controller 124 (e.g., a processing system) which analyzes the information collected using one or more algorithms.

The inspection system 100 may include any type of metrology system known in the art suitable for providing metrology signals associated with metrology targets on a sample. The optical imaging sub-systems 102 can comprise one or more hardware configurations. For example, optical imaging sub-systems 102 may include, but is not limited to, a spectrometer, a spectroscopic ellipsometer with one or more angles of illumination, a spectroscopic ellipsometer for measuring Mueller matrix elements (e.g., using rotating compensators), a single-wavelength ellipsometer, an angle-resolved ellipsometer (e.g., a beam-profile ellipsometer), a spectroscopic reflectometer (e.g., broadband reflective spectrometer), a single-wavelength reflectometer, an angle-resolved reflectometer (e.g., a beam-profile reflectometer), a pupil imaging system, a spectral imaging system, or a scatterometer (e.g. speckle analyzer). The hardware configurations can be separated into discrete operational systems. On the other hand, one or more hardware configurations can be combined into the inspection system 100. For example, multiple metrology heads may be integrated in the inspection system 100.

In one embodiment, the inspection system 100 is configured to provide spectroscopic signals indicative of one or more optical properties of a metrology target (e.g., one or more dispersion parameters, and the like) at one or more wavelengths. In one embodiment, the inspection system 100 includes an image-based metrology tool to measure metrology data based on the generation of one or more images of a sample. In another embodiment, the inspection system 100 includes a scatterometry-based metrology system to measure metrology data based on the scattering (reflection, diffraction, diffuse scattering, and the like) of light from the sample.

In one embodiment, the inspection system 100 includes one or more of the optical imaging sub-systems 102 (e.g., optical imaging tools). In some embodiments, the inspection system 100 may include a single optical imaging sub-system 102 or multiple of the optical imaging sub-systems 102 (e.g., FIG. 1B, FIG. 1C). Where the inspection system 100 is a spectroscopic imaging system, the multiple optical imaging sub-systems 102 of the spectroscopic imaging system may include a broadband spectroscopic ellipsometer, a spectroscopic ellipsometer with rotating compensator, a beam profile ellipsometer, a beam profile reflectometer, a broadband reflective spectrometer, a deep ultra-violet reflective spectrometer, and the like. It is further contemplated that the optical imaging sub-systems 102 include numerous optical elements in such systems, including certain lenses, collimators, mirrors, quarter-wave plates, polarizers, detectors, cameras, apertures, and/or light sources.

The one or more of the optical imaging sub-systems 102 are configured to generate one or more images of a sample 104. For example, an optical imaging sub-system 102 may include an illumination sub-system 106 configured to illuminate the sample 104 with illumination 108 from an illumination source 110 and a collection sub-system 112 configured to generate an image of the sample 104 in response to light emanating from the sample (e.g., sample light 114) the illumination 108 using a detector 116.

The illumination sub-system 106 includes one or more illumination sources 110. Examples of suitable light sources are: a white light source, an ultraviolet (UV) laser, an arc lamp or an electrode-less lamp, a laser sustained plasma (LSP) source, a supercontinuum source (such as a broadband laser source), or shorter-wavelength sources such as x-ray sources, extreme UV sources, or some combination thereof.

The illumination sources 110 may generate illumination 108. The illumination 108 may have only one wavelength (i.e., monochromatic light), several discrete wavelengths (i.e., polychromatic light), multiple wavelengths (i.e., broadband light) and/or sweeps through wavelengths, either continuously or hopping between wavelengths (i.e., tunable sources or swept source). For example, the illumination 108 may include wavelengths varying from about 120 nm to 3 microns. The illumination 108 may include a brightness, which in some cases may be a brightness greater than about 1 W/(nm cm2 Sr). The illumination 108 may be polarization-resolved, unpolarized, or the like.

The sample 104 may include a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. The sample 104 may further include one or more layers disposed on the substrate. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or un-patterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated.

The sample 104 may include one or more targets. The targets may also be referred to as metrology targets. The targets are interrogated by the inspection system 100. The targets can include certain regions of interest that are periodic in nature, such as gratings in a memory die. The metrology targets may include multiple layers (e.g., films) whose thicknesses can be measured by the inspection system 100. Targets can include target designs placed (or already existing) on the semiconductor wafer for use, for example, with alignment and/or overlay registration operations. Further, targets may be located at multiple sites on the semiconductor wafer. For example, targets may be located within scribe lines (e.g., between dies) and/or located in the die itself. In certain embodiments, multiple targets are measured (at the same time or at differing times) by the same or multiple metrology tools.

The optical imaging sub-system 102 may generate one or more images of the sample 104 using any technique known in the art. In some embodiments, the optical imaging sub-system 102 is an optical imaging sub-system 102, where the illumination source 110 is an optical source configured to generate illumination 108 in the form of light, and where the collection sub-system 112 images the sample 104 based on light emanating from the sample 104. In some embodiments, the imaging sub-system 102 is a particle imaging sub-system 102, where the illumination source 110 is a particle source configured to generate illumination 108 in the form of particles. For instance, particle illumination 108 may be in the form of an electron beam (e-beam), an ion beam (e.g., a focused ion beam), or a neutral-particle beam. Further, the collection sub-system 112 may image the sample 104 based on particles emanating from the sample 104 (e.g., backscattered electrons, or the like). In some cases, a particle inspection system 100 may also image the sample 104 based on light emanating from the sample 104 in response to the incident particle illumination 108 (e.g., based on photoluminescence, or the like).

The optical imaging sub-system 102 may, but is not required to, measure the composition of one or more layers of a multilayer stack (e.g., a planar multilayer stack, a multilayer grating, and the like) or one or more defects on or within a sample. Multiple targets may be measured simultaneously or serially by the same or multiple metrology tools. In certain embodiments, multiple targets are measured (at the same time or at differing times) by the same or multiple optical imaging sub-system 102. The data from such measurements may be combined.

The optical imaging sub-system 102 may provide various types of measurements related to semiconductor manufacturing. For example, the optical imaging sub-system 102 may provide one or more metrology metrics of one or more metrology targets such as, but not limited to, a metrology metric. In this regard, the optical imaging sub-system 102 may also be referred to as a metrology tool. The metrology metric may include, but is not limited to, structural and material characteristics of the sample 104, bandgap, critical dimensions (e.g., widths of fabricated features at a selected height), overlay of two or more layers, sidewall angles, film thicknesses, or process-related parameters (e.g., focal position of a sample during a lithography step, an exposure dose of illumination during a lithography step, and the like). The structural characteristics of the sample 104 may include, but are not limited to, dimensional characteristics of structures and films such as film thickness and/or critical dimensions of structures, overlay, etc. associated with various semiconductor fabrication processes. The material characteristics may include, but are not limited to, material composition associated with various semiconductor fabrication processes. The metrology metrics are used to facilitate process controls and/or yield efficiencies in the manufacture of semiconductor dies. It is recognized herein that semiconductor processes (e.g., deposition of a film, a lithography step, an etch step, and the like) performed by a semiconductor process tool may drift over time. Drift may be a result of a multitude of factors including, but not limited to, tool wear or drift in a control algorithm associated with the process. Further, the drift may affect one or more characteristics of a sample, which may, in turn, affect one or more metrology measurements (e.g., the metrology metric proportional to the bandgap, a critical dimension measurement, and the like). In this regard, metrology measurements may provide diagnostic information associated with one or more steps in a fabrication process. Metrology data may be utilized in the semiconductor manufacturing process for example to feed-forward, feed-backward and/or feed-sideways corrections to the process (e.g., a lithography step, an etch step, and the like) to provide a complete process-control solution.

In some embodiments, the inspection system 100 includes the controller 124. The optical imaging sub-system 102 is communicatively coupled to the controller 124. In this regard, the controller 124 may be configured to receive data including, but not limited to, metrology data (e.g., spectroscopic signals, images of the target, pupil images, and the like) or metrology metrics (e.g., a metrology metric proportional to a bandgap of a multilayer grating, critical dimensions, film thickness, composition, overlay precision, tool-induced shift, sensitivity, diffraction efficiency, through-focus slope, side wall angle, and the like). In some embodiments, the metrology data includes an indication of the measured spectral response (e.g., measured intensity as a function of wavelength) of the sample based on the one or more sampling processes from a spectrometer (e.g., the optical imaging sub-system 102).

The controller 124 may use the data from the optical imaging sub-system 102 in the semiconductor manufacturing process for example to feed-forward, feed-backward and/or feed-sideways corrections to the process (e.g., lithography, etch) and therefore, might yield a complete process control solution.

The controller 124 may include one or more processors 126 configured to execute program instructions maintained on a memory 128 (e.g., a memory medium). In this regard, the one or more processors 126 of controller 124 may execute any of the various process steps described throughout the present disclosure. The controller 124 may be communicatively coupled to the one or more optical inspection sub-systems 102. The controller 124 may receive images from the optical inspection sub-systems 102. For example, the controller 124 may receive the images from the detector 116.

The one or more processors 126 of a controller 124 may include any processing element known in the art. In this sense, the one or more processors 126 may include any microprocessor-type device configured to execute algorithms and/or instructions. In one embodiment, the one or more processors 126 may consist of a desktop computer, mainframe computer system, workstation, image computer, parallel processor, or any other computer system (e.g., networked computer) configured to execute a program configured to operate the inspection system 100, as described throughout the present disclosure. It is further recognized that the term "processor" may be broadly defined to encompass any device having one or more processing elements, which execute program instructions from a non-transitory memory 128.

The memory 128 may include any storage medium known in the art suitable for storing program instructions executable by the associated one or more processors 126. For example, the memory 128 may include a non-transitory memory medium. By way of another example, the memory 128 may include, but is not limited to, a read-only memory, a random-access memory, a magnetic or optical memory device (e.g., disk), a magnetic tape, a solid-state drive, and the like. It is further noted that memory 128 may be housed in a common controller housing with the one or more processors 126. In one embodiment, the memory 128 may be located remotely with respect to the physical location of the one or more processors 126 and controller 124. For instance, the one or more processors 126 of controller 124 may access a remote memory (e.g., server), accessible through a network (e.g., internet, intranet, and the like). Therefore, the above description should not be interpreted as a limitation on the present invention but merely an illustration.

Figure 1B:
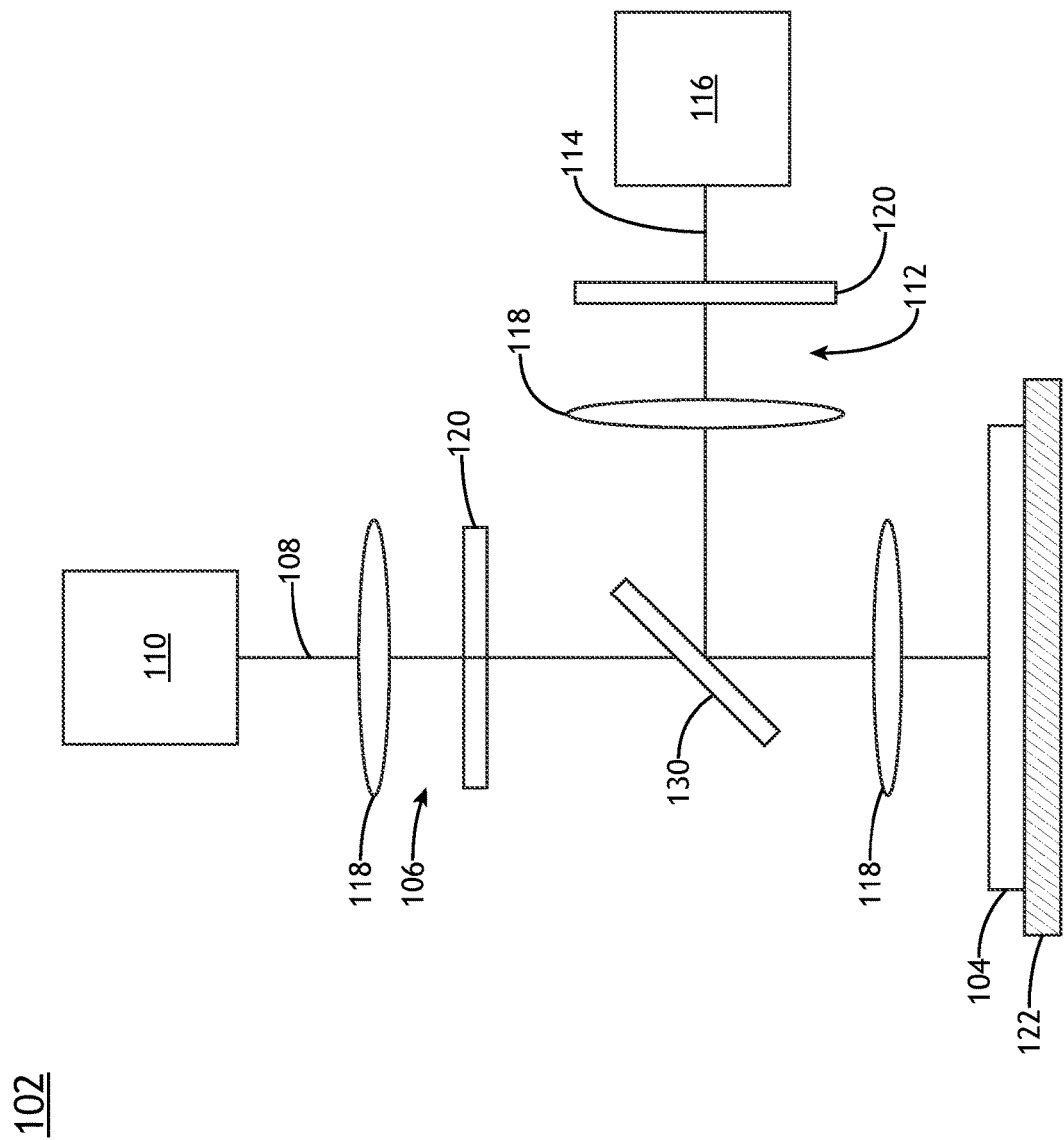
FIG. 1B illustrates a simplified schematic view of an inspection system suitable for optical measurements, in accordance with one or more embodiments of the present disclosure.

FIG. 1B is a simplified schematic view of the optical imaging sub-system 102, in accordance with one or more embodiments of the present disclosure.

The illumination source 110 may include any type of illumination source known in the art suitable for generating an optical illumination 108, which may be in the form of one or more illumination beams. Further, the illumination 108 may have any spectrum such as, but not limited to, extreme ultraviolet (EUV) wavelengths, ultraviolet (UV) wavelengths, visible wavelengths, or infrared (IR) wavelengths. Further, the illumination source 110 may be a broadband source, a narrowband source, and/or a tunable source.

In some embodiments, the illumination source 110 includes a broadband plasma (BBP) illumination source. In this regard, the illumination 108 may include radiation emitted by a plasma. For example, a BBP illumination source 110 may include, but is not required to include, one or more pump sources (e.g., one or more lasers) configured to focus into the volume of a gas, causing energy to be absorbed by the gas in order to generate or sustain a plasma suitable for emitting radiation. Further, at least a portion of the plasma radiation may be utilized as the illumination 108. In another embodiment, the illumination source 110 may include one or more lasers. For instance, the illumination source 110 may include any laser system known in the art capable of emitting radiation in the infrared, visible, or ultraviolet portions of the electromagnetic spectrum.

The illumination source 110 may produce illumination 108. The illumination 108 may have any temporal profile. For example, the illumination 108 may include continuous-wave (CW) illumination, pulsed illumination, or modulated illumination. Additionally, the illumination 108 may be delivered from the illumination source 110 via free-space propagation or guided light (e.g., an optical fiber, a light pipe, or the like).

The illumination sub-system 106 and/or the optical imaging sub-system 102 may include various components to direct the illumination 108 to the sample 104 such as, but not limited to, lenses 118, mirrors, or the like. Further, such components may be reflective elements or transmissive elements. In this way, the depiction of the lenses 118 in FIG. 1B as transmissive elements is merely illustrative and not limiting. The illumination sub-system 106 may further include one or more optical elements 120 to modify and/or condition light in the associated optical path such as, but not limited to, one or more polarizers, one or more filters, one or more beam splitters, one or more diffusers, one or more homogenizers, one or more apodizers, or one or more beam shapers. In embodiments, the illumination sub-system 106 and/or the optical imaging sub-system 102 includes a beam-splitter 130 oriented to simultaneously direct the illumination 108 to the sample 104 and collect sample light 114 emanating from the sample 104. In this regard, the illumination 108 and the sample light 114 may share the same path between the beam-splitter 130 and the sample 104.

In some embodiments, the inspection system 100 includes a translation stage 122 for securing and/or positioning the sample 104 during imaging. For example, the translation stage 122 may include any combination of linear actuators, rotational actuators, angle actuators, tip/tilt stages, and the like. The translation stage 122 may position the sample 104 using any number of degrees of freedom. In this regard, the translation stage 122 may position the sample 104 within a measurement field of view of the illumination 108.

The optical imaging sub-system 102 may include various components to collect at least a portion of the sample light 114 radiation emanating from the sample 104 (e.g., sample light in the case of an optical imaging sub-system 102) and direct at least a portion of the sample light 114 to a detector 116 for generation of an image.

The inspection system 100 may further image the sample 104 using any technique known in the art. In some embodiments, the inspection system 100 generates an image of the sample 104 in a scanning mode by focusing the illumination 108 onto the sample 104 as a spot or a line, capturing a point or line image, and scanning the sample 104 to build up a two-dimensional image. In this configuration, scanning may be achieved by moving the sample 104 with respect to the illumination 108 (e.g., using the translation stage 122), by moving the illumination 108 with respect to the sample 104 (e.g., using actuatable mirrors, or the like), or a combination thereof. The scanning may include scanning the sample 104 along a scan path to generate a swath of the scan path. In some embodiments, the inspection system 100 generates an image of the sample 104 in a static mode by directing the illumination 108 to the sample 104 in a two-dimensional field of view and capturing a two-dimensional image directly with the detector 116.

An image generated by the inspection system 100 may be any type of image known in the art such as, but not limited to, a brightfield image, a darkfield image, a phase-contrast image, or the like. In some embodiments, the images may be raw images from an optical imaging sub-system 102. In this configuration, the inspection images may include various patterned features on the sample. Further, images may be stitched together to form a composite image of the sample 104 or a portion thereof, although this is not intended as a limitation of the present disclosure. Although the images have been described as including the patterned features, this is not intended as a limitation of the present disclosure. It is further contemplated that the images may be from a sample or wafer with no patterned features.

The detector 116 may include any type of sensor known in the art suitable for measuring sample light 114. For example, a detector 116 may include a multi-pixel sensor such as, but not limited to, a charge-couple device (CCD), a complementary metal-oxide-semiconductor (CMOS) device, a line sensor, or a time-delay-integration (TDI) sensor. As another example, a detector 116 may include two or more single-pixel sensors such as, but not limited to, a photodiode, an avalanche photodiode, a photomultiplier tube, or a single-photon detector. In some embodiments, the detector 116 may include the TDI sensor. The TDI sensor may include multiple pixel rows and a readout row. The TDI sensor may include clocking signals that successively move charge from one pixel row to the next until the charge reaches the readout row, where a row of the image is generated. By synchronizing the charge transfer (e.g., based on the clocking signals) to the motion of the sample along the scan direction, charge may continue to build up across the pixel rows to provide a relatively higher signal to noise ratio compared to a line sensor.

An optical inspection mode may correspond to any combination of parameters used to generate an image of the sample 104 including, but not limited to, properties of illumination directed to the sample 104 or light collected from the sample 104. Further, imaging with different optical inspection modes may generally be performed with any number of optical imaging sub-systems 102. In some embodiments, the one or more optical imaging sub-systems 102 may be configurable to image the sample 104 with multiple optical inspection modes.

An optical inspection mode provided by the optical imaging sub-system 102 may be controlled based on control of any combination of components in the illumination sub-system 106 or the collection sub-system 112. For example, control of the illumination 108 directed to the sample 104 may be provided by the illumination source 110 directly and/or by optical elements 120 such as, but not limited to, a spectral filter to control a wavelength of the illumination 108, a polarizer to control a polarization of the illumination 108, or an apodizer (e.g., in an illumination pupil plane) to control an angular distribution of the illumination 108 on the sample 104. As another example, control of the sample light 114 collected from the sample 104 and passed to the detector 116 may be provided by optical elements 120 such as, but not limited to, a spectral filter to control a wavelength of the sample light 114 passed to the detector 116, a polarizer to control a polarization of the sample light 114 passed to the detector 116, or an apodizer (e.g., in a collection pupil plane) to control an angular distribution of the sample light 114 passed to the detector 116.

As an illustration, a particular optical inspection mode may correspond to illumination 108 with a selected spectrum (e.g., as described by a bandwidth and/or a central wavelength) and a selected polarization directed to the sample with a selected incidence angle (e.g., as defined by an illumination aperture or apodizer). The optical inspection mode may further correspond to a particular spectrum and polarization of the sample light 114 directed to the detector 116 (both of which may be the same or different than for the illumination 108 incident on the sample 104).

Further, the illumination source 110 and/or any of the optical elements 120 may be adjustable such that the inspection system 100 may be configured to provide different optical inspection modes. For example, any of the optical elements 120 may be directly tunable and/or controllable by actuators to provide different optical inspection modes. In some embodiments, the controller 124 generates drive signals for the illumination source 110 and/or any of the optical elements 120 to select-ably provide different optical inspection modes.

In embodiments, the optical imaging sub-systems 102 may generate one or more images. The images may include inspection images and reference images, as will be described further herein. In embodiments, the optical image sub-systems 102 may generate the one or more images using one or more optical modes.

It is contemplated herein that defects on a sample may respond differently to imaging with different optical modes such that defect analysis or identification may be improved by considering images generated with different optical modes. Additional embodiments of the present disclosure are directed to inspection systems suitable for performing multi-mode optical inspection. It is contemplated herein that multi-mode inspection may provide substantially superior performance (e.g., discrimination between defects and background signals) than single-mode inspection techniques. Further, increasing the number of inspection modes may generally increase the inspection performance. However, it is further recognized herein that it may be desirable to balance the number of optical inspection modes used during inspection, particularly if such multi-mode inspection requires multiple imaging scans and thus takes longer to perform.

In some embodiments, a single optical imaging sub-system 102 may be configured to image the sample 104 with multiple optical inspection modes simultaneously or sequentially. In some embodiments, different optical imaging sub-systems 102 are used to provide at least some different optical inspection modes.

In some embodiments, the inspection system 100 provides images with different optical inspection modes sequentially. For example, the inspection system 100 may sequentially switch between different optical imaging sub-systems 102 and/or adjust parameters of an optical imaging sub-system 102 to provide sequential images of the sample 104 with different optical inspection modes.

In some embodiments, the optical imaging sub-system 102 may be configured to simultaneously provide two or more images with different optical inspection modes simultaneously. As an illustration, an optical imaging sub-system 102 may include two or more collection channels, each having separate detector 116. The optical imaging sub-system 102 may then have one or more beam splitters to split the sample light 114 into the various channels and/or additional optical elements 120 (e.g., separate spectral filters, polarizers, or the like) to provide separate control of the properties of the sample light 114 directed to the associated detector 116 in each channel.

Figure 1C:
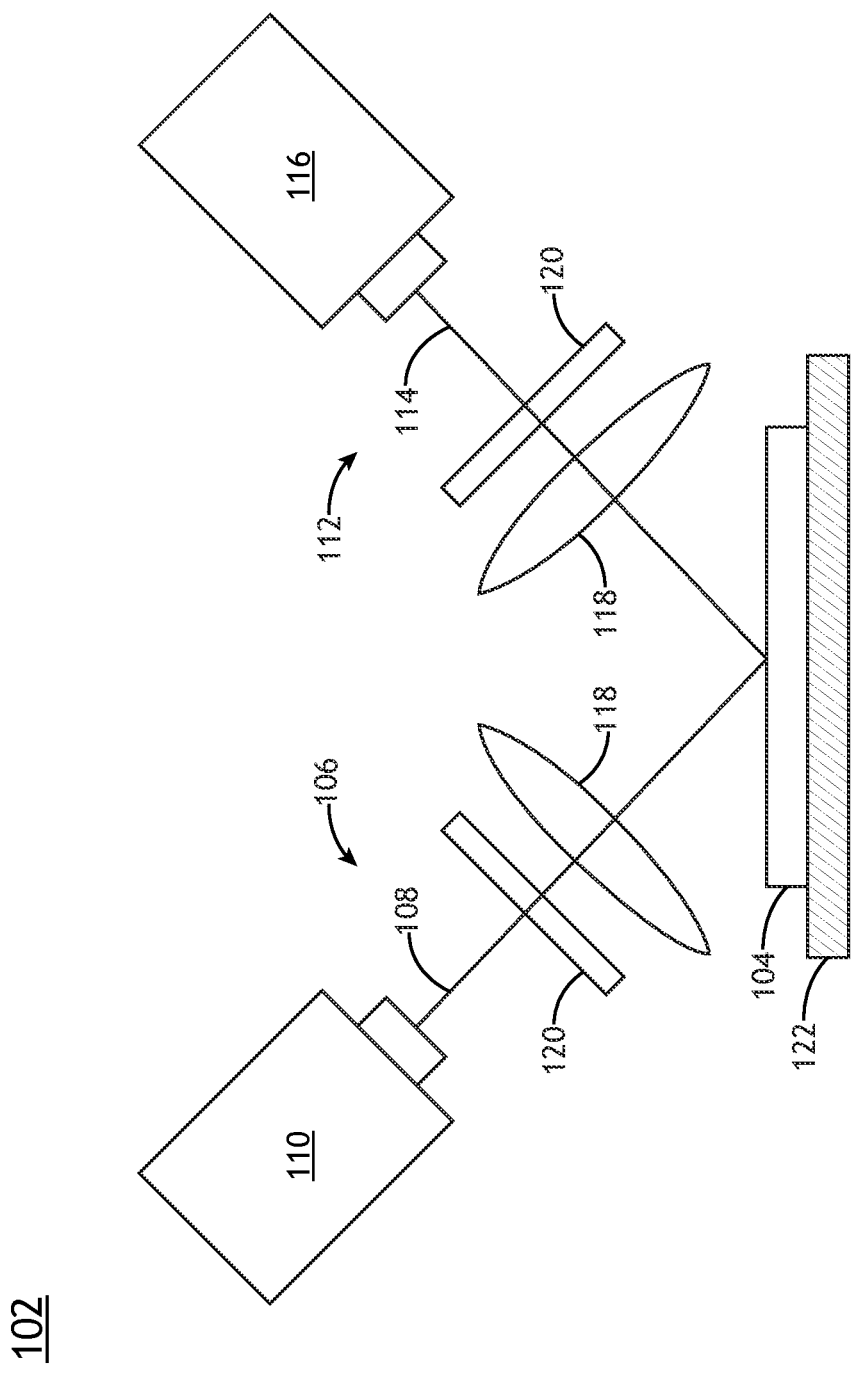
FIG. 1C illustrates a simplified schematic view of an inspection system suitable for optical measurements, in accordance with one or more embodiments of the present disclosure.

FIG. 1C is a simplified schematic view of the optical imaging sub-system 102, in accordance with one or more embodiments of the present disclosure.

In one embodiment, the optical imaging sub-system 102 includes the illumination source 110 to generate the illumination 108. The illumination 108 may include one or more selected wavelengths of light including, but not limited to, ultraviolet (UV) radiation, visible radiation, or infrared (IR) radiation. For example, the illumination source 110 may include, but is not limited to, one or more narrowband laser sources, one or more a broadband laser sources, one or more supercontinuum laser sources, one or more white light laser sources, and the like. In this regard, the illumination source 110 may provide illumination 108 having high coherence (e.g., high spatial coherence and/or temporal coherence). In another embodiment, the illumination source 110 includes a laser-driven light source (LDLS) such as, but not limited to, a laser-sustained plasma (LSP) source. For example, the illumination source 110 may include, but is not limited to, a LSP lamp, a LSP bulb, or a LSP chamber suitable for containing one or more elements that, when excited by a laser source into a plasma state, may emit broadband illumination. In another embodiment, the illumination source 110 includes a lamp source. By way of another example, the illumination source 110 may include, but is not limited to, an arc lamp, a discharge lamp, an electrode-less lamp, and the like. In this regard, the illumination source 110 may provide illumination 108 having low coherence (e.g., low spatial coherence and/or temporal coherence).

In another embodiment, the illumination source 110 is configured to provide illumination having wavelengths surrounding an expected bandgap of a test layer such as, but not limited to, "high-k" insulating layers having bandgaps in the UV spectral region or layers of a memory structure having bandgaps in the IR spectral region) of a multilayer grating structure. For example, the illumination source 110 may include, but is not required to include, a LDLS providing wavelengths in a spectral range between approximately 120 nanometers and 3 microns. By way of another example, the illumination source 110 may provide wavelengths greater than approximately 150 nanometers suitable for determining the bandgap of insulating layers. By way of another example, the illumination source 110 may provide wavelengths greater than approximately 700 nanometers suitable for determining the bandgap of layers of a memory structure.

In another embodiment, the illumination source 110 provides a tunable illumination 108. For example, the illumination source 110 may include a tunable source of illumination (e.g., one or more tunable lasers, and the like). By way of another example, the illumination source 110 may include a broadband illumination source coupled to a tunable filter.

The illumination source 110 may further provide illumination 108 having any temporal profile. For example, the illumination 108 may have a continuous temporal profile, a modulated temporal profile, a pulsed temporal profile, and the like.

In another embodiment, the illumination source 110 directs the illumination 108 to the sample 104 via an illumination pathway of the illumination sub-system 106 and collects radiation emanating from the sample via a collection pathway of the collection sub-system 112. The illumination pathway may include one or more beam conditioning components suitable for modifying and/or conditioning the illumination 108. For example, the one or more beam conditioning components may include, but are not limited to, one or more polarizers, one or more filters, one or more beam splitters, one or more diffusers, one or more homogenizers, one or more apodizers, or one or more beam shapers, or one or more lenses.

In another embodiment, the illumination sub-system 106 may utilize one or more lenses 118 to focus the illumination 108 onto the sample 104. The illumination sub-system 106 may further include one or more optical elements 120 to modify and/or condition light in the associated optical path such as, but not limited to, one or more polarizers, one or more filters, one or more beam splitters, one or more diffusers, one or more homogenizers, one or more apodizers, or one or more beam shapers.

In another embodiment, the collection sub-system 112 may include one or more lenses 118 to collect radiation from the sample 104. The collection sub-system 112 may further include one or more optical elements 120 to modify and/or condition light in the associated optical path such as, but not limited to, one or more polarizers, one or more filters, one or more beam splitters, one or more diffusers, one or more homogenizers, one or more apodizers, or one or more beam shapers.

In another embodiment, the optical imaging sub-system 102 includes a detector 116 configured to capture radiation emanating from the sample 104 through the collection pathway. For example, a detector 116 may receive radiation reflected or scattered (e.g., via specular reflection, diffuse reflection, and the like) from the sample 104. By way of another example, a detector 116 may receive radiation generated by the sample 104 (e.g., luminescence associated with absorption of the illumination 108, and the like). By way of another example, a detector 116 may receive one or more diffracted orders of radiation from the sample 104 (e.g., 0-order diffraction, ±1 order diffraction, ±2 order diffraction, and the like).

The detector 116 may include any type of optical detector known in the art suitable for measuring illumination received from the sample 104. For example, a detector 116 may include, but is not limited to, a CCD detector, a CMOS detector, a TDI detector, a photomultiplier tube (PMT), an avalanche photodiode (APD), and the like. In another embodiment, a detector 116 may include a spectroscopic detector suitable for identifying wavelengths of radiation emanating from the sample 104.

The collection sub-system 112 may further include any number of collection beam conditioning elements to direct and/or modify illumination collected including, but not limited to one or more lenses, one or more filters, one or more polarizers, or one or more phase plates. In this regard, the optical imaging sub-system 102 may be configured as any type of metrology tool such as, but not limited to, a spectroscopic ellipsometer with one or more angles of illumination, a spectroscopic ellipsometer for measuring Mueller matrix elements (e.g., using rotating compensators), a single-wavelength ellipsometer, an angle-resolved ellipsometer (e.g., a beam-profile ellipsometer), a spectroscopic reflectometer, a single-wavelength reflectometer, an angle-resolved reflectometer (e.g., a beam-profile reflectometer), an imaging system, a pupil imaging system, a spectral imaging system, or a scatterometer.

Further, it is noted herein that the optical imaging sub-system 102 depicted may facilitate multi-angle illumination of the sample 104, and/or more than one illumination source 110 coupled to one or more additional detectors. In this regard, the optical imaging sub-system 102 may perform multiple metrology measurements.

In another embodiment, one or more optical components may be mounted to a rotatable arm (not shown) pivoting around the sample 104 such that the angle of incidence of the illumination 108 on the sample 104 may be controlled by the position of the rotatable arm. In another embodiment, the optical imaging sub-system 102 may include multiple detectors (e.g., associated with multiple beam paths generated by one or more beam-splitters) to facilitate multiple metrology measurements (e.g., multiple metrology tools) by the optical imaging sub-system 102.

Figure 2A:
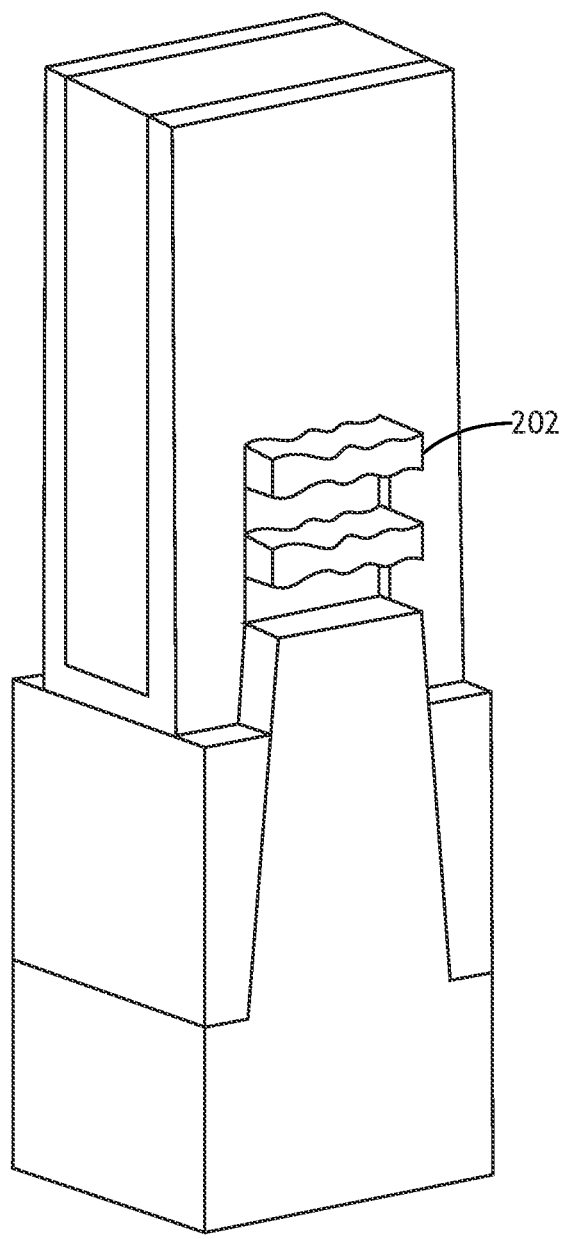
FIG. 2A illustrates a view of a structure of a sample including one or more nanosheets, in accordance with one or more embodiments of the present disclosure.

FIG. 2A is a perspective view of a structure 200 of the sample 104, in accordance with one or more embodiments of the present disclosure. The structure 200 generally refers to one or more structures, specimens, metrology targets, or the like of the sample 104. In some embodiments, the structure under measurement includes two or more geometric features each fabricated from a different material. The geometric features may define various semiconductor transistors. For example, the structure 200 may include, but are not limited to, thin film stacks, Fin field-effect-transistor (FinFETs), gate-all-around (GAA) transistors (e.g., GAA FETs), partially fabricated transistor structures, and future generations of DRAM and 3D flash memory structures. As depicted, the structure 200 is a post nanosheet release GAA model (unit cell).

In embodiments, the structure 200 may include one or more nanosheets 202. The nanosheets 202 may be a two-dimensional nanostructure with a thickness in a scale ranging from 1 to 100 nm. For example, the nanosheets 202 may include nanosheet profile with a thickness of 5 nanometers or below. In the example depicted, the structure 200 is a GAA FET and the nanosheet 202 is a silicon nanosheet which acts as a conducting channel in the GAA transistor, although this is not intended to be limiting. The nanosheet 202 is wrapped all around by a series of materials that form the gate of the device. The wrapper materials include materials such as silicon dioxide, hafnium oxide, titanium nitride, tantalum nitride, etc. The wrapper materials are deposited on the nanowire using an atomic layer deposition process forming a wrapping gate all around the nanowire channel.

Local thickness fluctuations at the nanometer scale become critical for the performance of the sample 104 when the thickness of the nanosheet 202 in transistors reach below 5 nanometers (sub-5 nm). Several undesired effect may occur when the thickness of the nanosheet is non-uniform including, but not limited to, performance variability from one transistor to another transistor, performance variation from one nanosheet to another nanosheet within the same transistor, a threshold voltage drift in the drive current from designed expectations, and/or a change in off-state leakage.

In some embodiments, the local thickness fluctuations in the nanosheet 202 are induced by surface roughness of the nanosheet 202. In some embodiments, carrier mobility is sensitive to the thickness. The carrier mobility can vary significantly through the channel when the vertical dimension of the roughness is sufficiently large compared to the mean thickness of the horizontal nanosheet. The carrier velocity and other dynamic parameters also change from one point to another in the cross-section of the nanosheet due to the surface non-uniformity.

Although much of the disclosure is described in the context of nanosheets, this is not intended as a limitation of the present disclosure. It is further contemplated that the embodiments of the nanosheets may be equally applicable to transistors with nanowires. In this regard, nanosheets and nanowires may be used interchangeably herein.

Figure 2B:
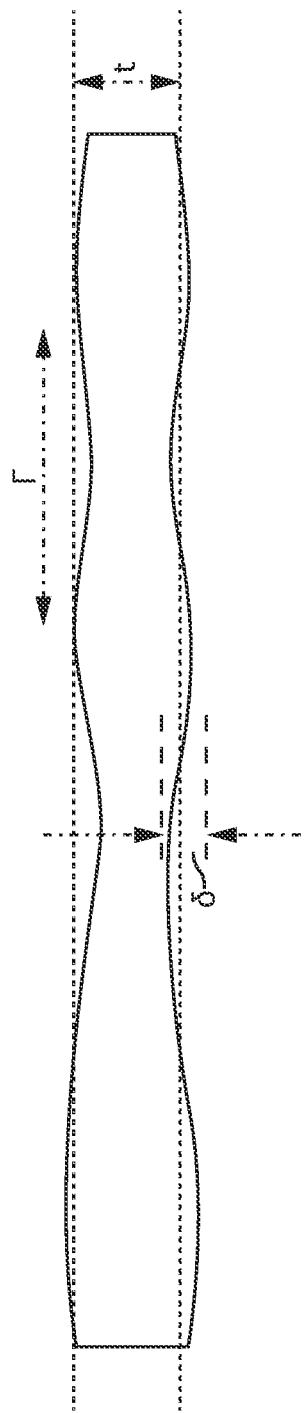
FIG. 2B illustrates a nanosheet with a surface roughness, in accordance with one or more embodiments of the present disclosure.

Referring now in particular to FIG. 2B, an illustration of nanosheet 202 including roughness with thickness mean (t), roughness amplitude (δ), and correlation length (wavelength) Γ. The surface roughness may be quantified in terms of the root mean square of the roughness amplitude δ and the correlation length (wavelength) Γ. In this example, the nanosheet 202 is at the post nanosheet release process, although this is not intended to be limiting. As depicted, the surface roughness of the nanosheet 202 is anisotropic.

In the case of a GAA transistor, the nanosheets are relatively narrow to undergo large variations in the sub-band energies. The energy of the confined carrier is a function of the nanosheet thickness, t and the associated discrete energies are given by:

$$E_n = \frac{(\hbar n\pi)^2}{2mt^2} = \frac{\hbar^2 k^2}{2m}$$

Where E is energy in the nanosheets, $\hbar$ is Planck's constant, n is an integer quantum number, m is the carrier effective mass, and k the wave vector associated with each energy level (k=nπ/t). The energies in the quantum nanosheets are inversely proportional to the square of the nanosheet thickness t.

The effective mass and the mobility μ are linked by:

$$\mu = q\tau/m$$

Where q is the carrier charge, τ is the carrier lifetime

The perturbation in the nanosheet thickness from t to t+δ is directly translated into energy levels En fluctuations across the nanosheet which manifest itself in variation of the effective mass and the carrier's mobility μ. Such a random fluctuations in $E_n$ will scatter the electrons and holes carriers and will result in a mobility varying with the nanosheet thickness given by:

$$\mu \propto \frac{t^2}{\delta^2 \Gamma^2}$$

The equation for the carrier's mobility μ is valid for materials with low effective mass such as Si (for electrons 0.187 $m_0$). The equation for the carrier's mobility μ establishes direct and quantitative relationship between the random variation in the nanosheet thickness due to interface or surface roughness and the carrier mobility. Any strong variation in the roughness will result in device performance degradation.

The major factor contributing to the anomalous surface roughness occurs at a post nanosheet release process. The optimization of the GAA process from the superlattice film stack to the nanosheet release, specifically the wet etch, should be done in a way the nanosheet surfaces are kept as flat as possible. Hence the need for a non-destructive, high-throughput, and accurate metrology method that enables monitoring the nanosheet roughness followed by mitigation of the nanosheet roughness to ensure final device performance meet the designed specifications.

The nanosheet 202 profile may include at least one of a diamond cross-section, an elliptical cross-section, a triangular cross-section, a rectangular cross-section, or a trapezoidal cross-section. The nanosheet 202 profile may include a thickness of 5 nanometers or below.

Figure 3:
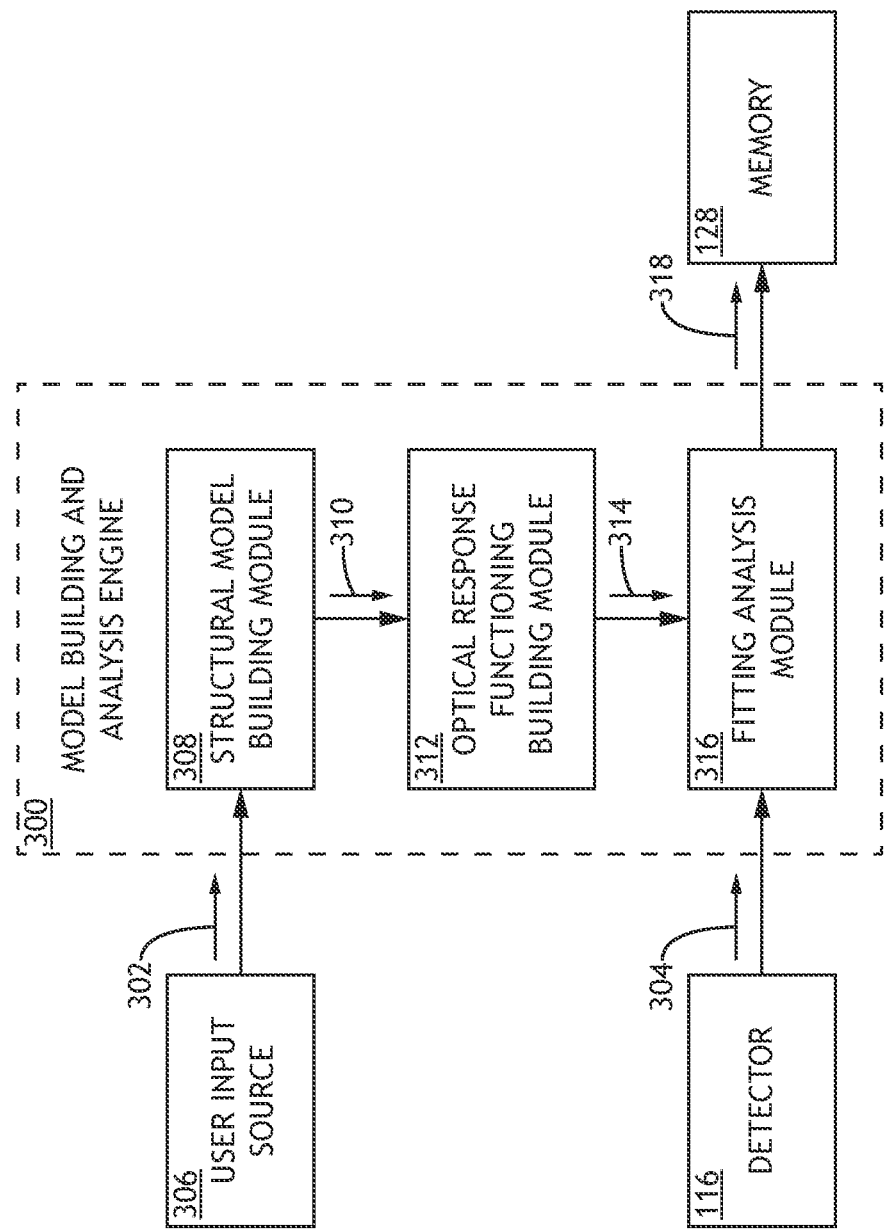
FIG. 3 depicts a block diagram of a model building and analysis engine, in accordance with one or more embodiments of the present disclosure.

Referring now to FIG. 3, a model building and analysis engine 300 is described, in accordance with one or more embodiments of the present disclosure. The controller 124 is configured to execute the model building and analysis engine 300. The model building and analysis engine 300 is a set of program instructions stored in memory 128. The program instructions are executed by the one or more processors 126 to realize a model building and analysis functionality.

The model building and analysis engine 300 is configured to receive one or more inputs, such as, but not limited to, user input 302 and/or measured data 304. In some embodiments, the controller 124 is configured to receive user input 302 from a user input source 306 of the inspection system 100, such as a graphical user interface, keyboard, and the like. In some embodiments, the controller 124 is configured to the measured data 304 from the detector 116. The measured data 304 may include, but is not limited to, a measured spectra of the structure 200 of the sample 104 detected by the detector 116. The measured data 304 may include various values for a given set of measurement system parameter values (e.g., angle of incidence, azimuth angle, illumination polarization, electric field orientation, etc.).

In some embodiments, the model building and analysis engine 300 includes a structural model building module 308. The structural model building module 308 generates a structural model 310. The structural model building module 308 may generate the structural model 310 based, at least in part, on the user input 302. In some embodiments, the structural model building module 308 is implemented in the AcuShape software product manufactured by KLA, Corporation, Milpitas, Calif. (USA). In one example, the AcuShape software includes a set of geometric features (e.g., 1D layer, 2D trapezoid, 3D post, etc. that are joined together and parameterized to simulate the structure under measurement. In addition, the AcuShape software includes a set of building blocks available for the user to assign material behavior to any of the modeled structural features. In this manner, the user input 302 may include a selection of which material (i.e., which portion of the modeled structure) will be characterized with dispersion properties.

In some embodiments, the structural model 310 is of a structure (e.g., structure 200) of the sample 104. For example, the structural model 310 may be a nanosheet and/or nanowire-based semiconductor structure. In some embodiments, structural model 310 also includes material properties of the target. In some embodiments, the structural model 310 includes a characterization of the optical dispersion properties of one or more of these different materials. In general, the structural model 310 may include any optical dispersion model. By way of non-limiting example, the dispersion model includes a Bruggeman Effective Medium Approximation (EMA) (BEMA) model, a Cody-Lorentz model, a Tauc-Lorentz model, a harmonic oscillator model, and a point-to-point dispersion model.

A component of semiconductor metrology for in-device or device-like targets is the modeling of the optical interaction of an incident beam with the sample using an electromagnetic solver. In some embodiments, the model building and analysis engine 300 includes an optical response function building module 312. The structural model 310 is received as input to the optical response function building module 312. The optical response function building module 312 generates an optical response function model 314 based at least in part on the structural model 310. In some embodiments, optical response function building module 312 characterizes the optical interaction of the incident beam with the structure under measurement using an electromagnetic solver employing algorithms such as rigorous coupled wave analysis (RCWA), finite element method (FEM), method of moments, surface integral method, volume integral method, finite difference, time domain (FDTD) method, and other simulation algorithms. Any of the simulation algorithms may rely on pre-determined dispersions of individual components of the measurement targets. Given the geometric model 310 together with dispersion parameters (e.g., n and k) of different parts of the structure, the optical response function building module 312 can solve the Maxwell equation and/or some form of the Schrodinger equations. Such a solution can then be used to derive simulated signals. The RCWA method may determine the structure from the measured spectra by solving Maxwell's equations with the structure dielectric function expanded as Fourier series. The RCWA method requires measuring a periodic structure. Therefore, RCWA assumes the electric field interacts with a repeating grating. In some embodiments, the optical dispersion models described herein are implemented in the Film Thickness Measurement Library (FTML) of the Off-line Spectral Analysis (OLSA) stand-alone software available from KLA Corporation, Milpitas, Calif. (USA).

The optical response function model 314 may be a modeled optical response of the sample 104 and/or the target (e.g., the structure 200). The modeled optical response may include various values determined for a given set of measurement system parameter values (e.g., angle of incidence, azimuth angle, illumination polarization, electric field orientation, etc.).

In some embodiments, the model building and analysis engine 300 includes a fitting analysis module 316. The optical response function model 314 and/or the measured data 304 is received as input to the fitting analysis module 316. In some examples, the fitting analysis module 316 resolves at least one specimen parameter value by performing a fitting analysis on the measured data 304 with the optical response function model 314.

The fitting analysis module 316 analyzes measured data 304 by any number of different data fitting and optimization techniques. By way of non-limiting example, fitting analysis module 316 may implement library matching techniques, fast-reduced-order modeling techniques, regression, machine-learning algorithms such as neural networks, support-vector machines (SVM), dimensionality-reduction algorithms such as principle component analysis (PCA), independent component analysis (ICA), local-linear embedding (LLE), sparse representation techniques such as Fourier or wavelet transform techniques, Kalman filtering, and algorithms to promote matching across the same or different tool types, etc. The fitting of spectral measurement data is advantageous for any type of optical technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing optical beam interaction with the specimen are used.

Regression can be used to minimize an error function (e.g., a square of differences between simulated and measured signals) over the space of unknown parameters (e.g., geometric parameters, material parameters, other parameters). In an example, the unknown parameters are repeatedly guessed until simulated spectra in the optical response function model 314 and measured spectra in the measured data 304 are sufficiently matched. In an example of machine learning, a model can be trained based on a simulator that can output unknown parameters from a given spectra. Once the model is available, feeding a measured spectra to the model can output resulting values for unknown parameters.

The fitting analysis module 316 compares the optical response function model 314 with the corresponding measured data 304 to generate a parametric sub-structure model 318. The parametric sub-structure model 318 may be a structural model of the target (e.g., the nanosheet or nanowire-based semiconductor structure under measurement). The parametric sub-structure models 318 may be considered re-useable. The parametric sub-structure model 318 may include values of optical properties of the sample 104, geometric properties of the sample 104, and/or material properties of the sample 104.

In some embodiments, the parametric sub-structure model 318 is a machine learning based model (e.g., neural network model, linear model, a polynomial model, a response surface model, a support vector machines model, random forest model, or other types of models). The machine learning based model is trained based on spectral signals collected from metrology targets having known geometric profiles, for example, geometric profiles accurately measured by a reference metrology system, such as the x-ray and electron-based metrology systems described hereinbefore. In some embodiments, the parametric sub-structure model 318 is determined based on measured training data (e.g., spectra collected from a Design of Experiments (DOE) wafer). The parametric sub-structure model 318 may then be used to calculate process parameter values, structure parameter values, or both, directly from measured data (e.g., spectra) collected from other wafers.

Thus, the controller 124 is configured to generate the structural model 310 (e.g., geometric model, material model, or combined geometric and material model) of a measured structure of the sample 104, generate the optical response model 314 that includes at least one geometric parameter from the structural model 310, and resolve at least one parameter value by performing a fitting analysis of optical measurement data 304 with the optical response model 314.

In some embodiments, the inspection system 100 is configured to store the parametric sub-structure models 318 in memory 128. The parametric sub-structure models 318 may then be one of a library of pre-computed models for determining a value of at least one parameter value associated with the sample 104.

In some embodiments, the controller 124 is configured to access model parameters in real-time, employing Real Time Critical Dimensioning (RTCD), or it may access libraries of pre-computed models for determining a value of at least one parameter value associated with the sample 104. Some form of CD-engine may be used to evaluate the difference between assigned CD parameters and CD parameters associated with the measured data 304 of the sample 104. The controller 124 uses the model building and analysis engine 300 to compare the simulated optical response signals with the measured data 304 thereby allowing the determination of geometric as well as material properties of the sample 104.

Figure 4A:
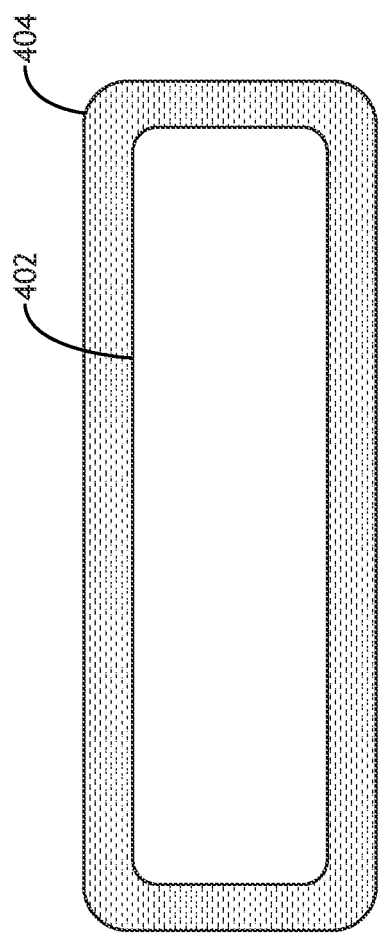
FIG. 4A depicts a view of an effective medium approximation (EMA) model profile, in accordance with one or more embodiments of the present disclosure.

Referring now to FIG. 4A, an effective medium approximation (EMA) model profile 400 is described, in accordance with one or more embodiments of the present disclosure. The EMA model profile 400 is an example of the structural model 310 provided to the optical response function building module 312. The EMA model profile 400 is an isotropic EMA. The isotropic EMA approximates the surface roughness of the nanosheet 202 profile using two layers. The EMA model profile 400 includes a homogenous layer 402 and a roughness layer 404. The nanosheet 202 is represented by the homogenous layer 402 and the roughness layer 404. In this regard, the nanosheet 202 is represented in two parts.

The homogenous layer 402 includes a thickness derived from the thickness of the nanosheet 202 reduced by the surface roughness. The homogenous layer 402 is assigned dispersion parameters (e.g., regular Si dielectric function).

The roughness layer 404 may also be referred to as a surface layer or an interface layer. The roughness layer 404 is non-homogenous and includes a mixture of materials due to the surface roughness. The roughness layer 404 is isotropic. The roughness layer 404 is a wrapper around the homogenous layer 402. The roughness layer 404 includes a thickness coupled with the amplitude of the roughness. The roughness layer 404 includes dispersion parameters simulated using an effective medium approximation (EMA). The dispersion relationship then approximates the dispersion of the surface roughness. The EMA is possible when the local variations in permittivity associated with the surface roughness are small compared to the wavelength of the light interacting with the media. The roughness layer 404 includes the EMA determined as a function of the material of the nanosheet 202 and a second material. For example, the material of the nanosheet 202 may be silicon and the second material may be air, although this is not intended to be limiting. The dispersion parameters are simulated the as the mixture of the silicon and air. The mixture of silicon and air may be a constant and/or may be floated.

In some embodiments, the mixture of silicon and air is a constant. For example, the EMA dielectric function may be simulated as a mixture of 50% Si and 50% air. The mixture of 50% Si and 50% air may impact the roughness accuracy measurement since the actual medium is not in a ratio of 50:50. These inaccuracies are not small for nanosheet thicknesses in the order of 5 nm.

In some embodiments, the fraction of the EMA is floated in the model and constrained with the roughness thickness standard variation $\sigma$. The conversion factor between the EMA fraction and $\sigma$ is determined experimentally through a design of experiment. $\sigma$ is the standard deviation of the nanosheet thickness measured at a number of locations along the gate. An RCWA based model is then created linking the EMA to a roughness index $\sigma$. The extraction of the roughness comes down to solving the Maxwell equations with the modeled dielectric functions of the structure including the EMA. The assumption, validated by the real process, is that the roughness index is periodic within the measurement spot.

The EMA model profile 400 may thus be used as the geometric model 310 and approximates the surface roughness of the nanosheet 202 profile. The optical response function model 314 of the structure 200 of the sample 104 to the illumination 108 is generated based at least in part on the geometric model 310 (e.g., on the EMA model profile 400). The optical response function model 314 then simulates the optical response of the nanosheet 202 profile with the surface roughness to the illumination 108. For example, the optical response function model 314 simulates the optical response using the dispersion parameters of the homogenous layer 402 and the roughness layer 404. Since the roughness parameter is of low sensitivity, the optical response function model 314 is provided to generate the parametric sub-structure model 318 (e.g., machine learning model) based on at least the optical response function model 314. The low volume of the roughness compared to the whole structure makes it hard to detect its variations out of other high sensitivity parameters. In that regard, the RCWA conventional model is used to simulate the underlaying process variation.

An experiment using the EMA model profile 400 is now described. A set of 400 synthetic spectra were generated using the EMA model profile 400 with varying nanosheet thickness 3-Sigma (3σ) between 0.3 nm and 2.6 nm. The set of synthetic spectra were used to train the parametric substructure model 318 (e.g., a neural network model). The parametric sub-structure model 318 was then validated with a blind test set of 50 spectra. The parametric sub-structure model 318 was determined to extract the nanosheet roughness 3σ from the blind test set to an accepted accuracy level of 0.97 R-squared. For example, the EMA model profile 400 was experimentally determined using Full Mueller Matrix spectroscopy to an accuracy level of R-squared value between 0.9718 and 0.9777.

Figure 4B:
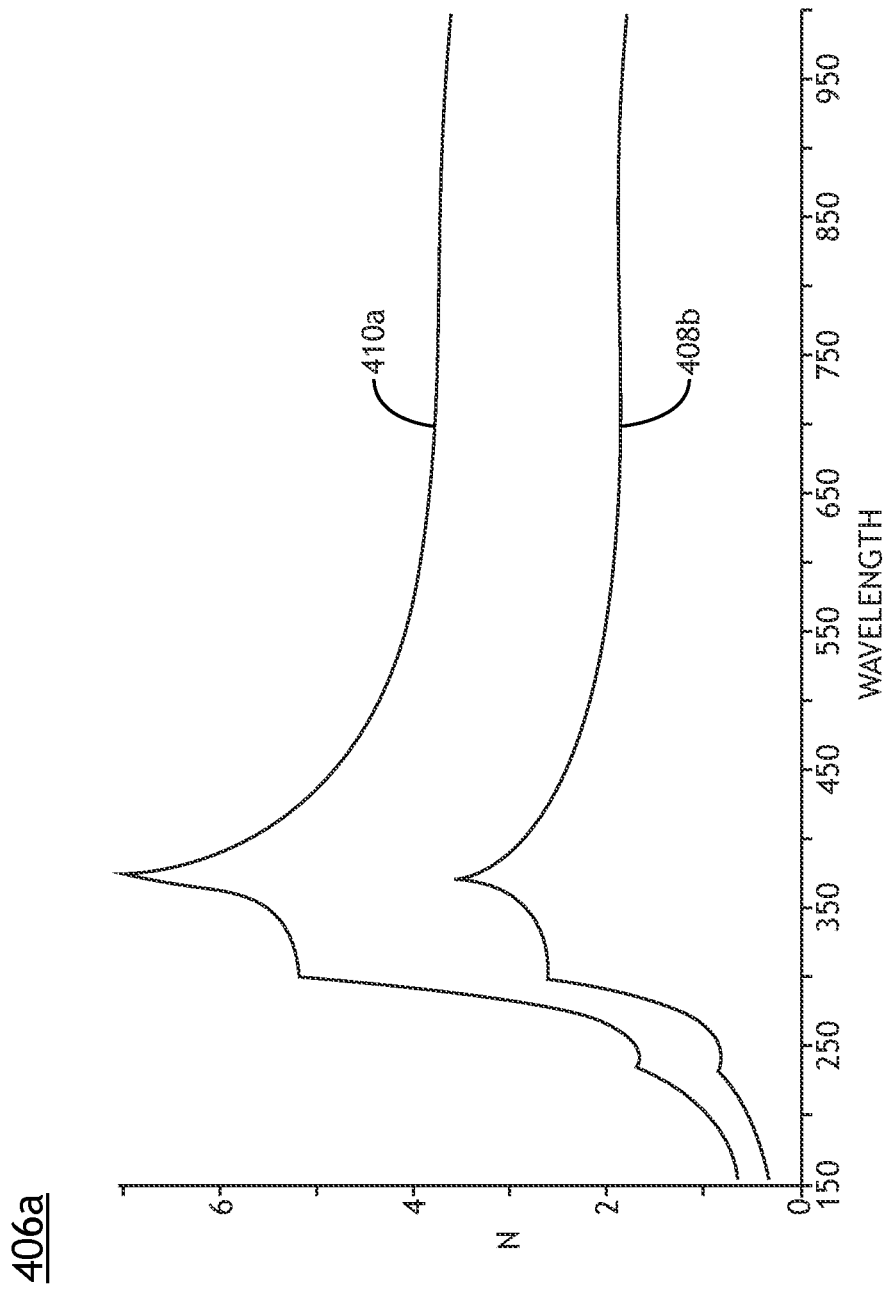
FIGS. 4B-4C depict plots of dispersion parameters of an EMA model profile, in accordance with one or more embodiments of the present disclosure.
Figure 4C:
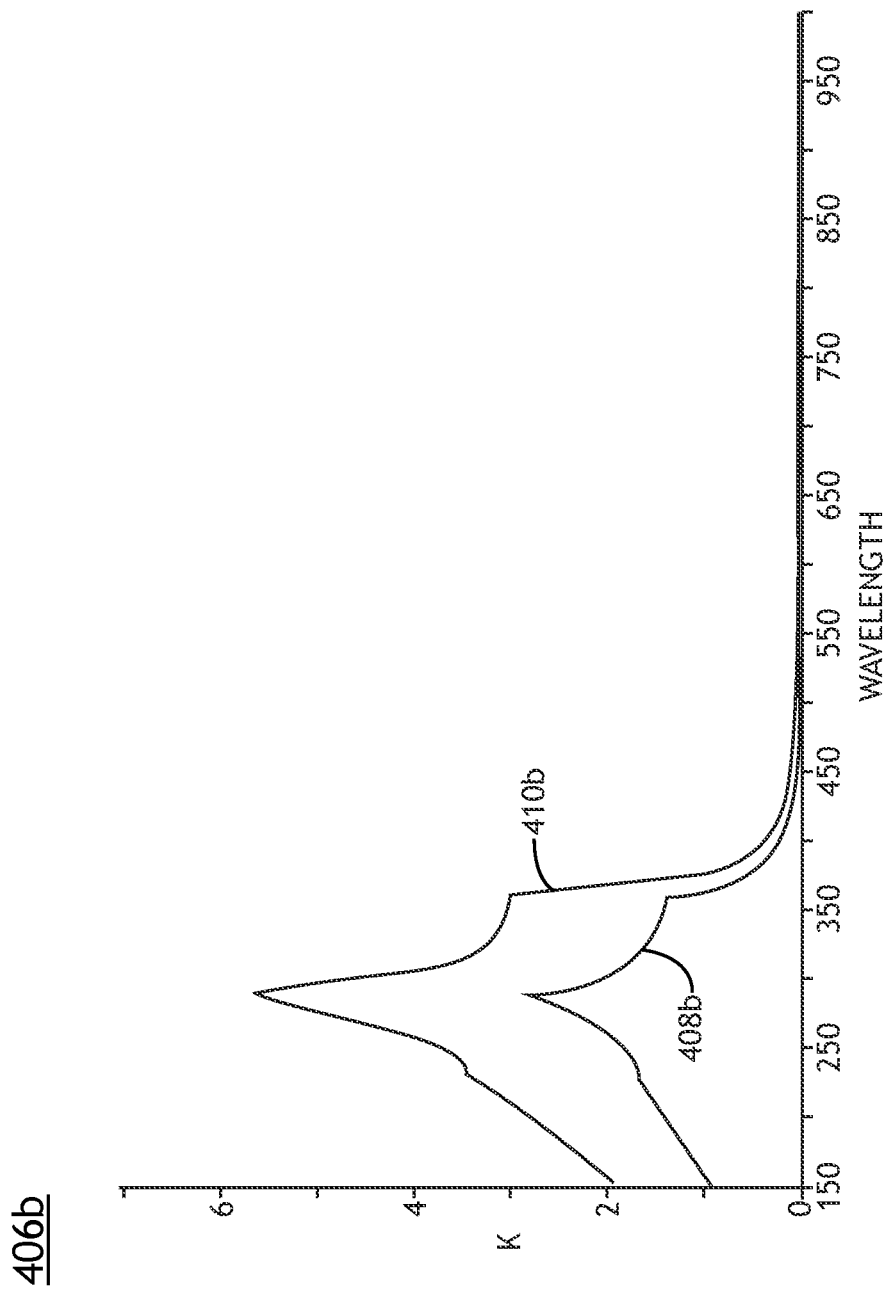

Referring now to FIGS. 4B-4C, depicts plots 406a-406b of dispersion parameters of the EMA model profile 400, in accordance with one or more embodiments of the present disclosure. The dispersion parameters may also be referred to as optical properties over one or more wavelengths of illumination. The plots 406a-406b include the dispersion parameters for the homogenous layer 402 and dispersion parameters for the roughness layer 404. The plots 406a-406b are plotted over a range of illumination wavelengths. For example, the plots 406a-406b are plotted over a range from 150 to 950 nm, although this is not intended to be limiting.

The plot 406a depicts the real component of the dispersion parameters, also referred to as refractive index (n). The plot 406a include plotline 408a and plotline 410a. The plotline 408a depicts the refractive index (n) of the roughness layer 404 over the illumination wavelengths. The plotline 410a depicts the refractive index (n) of the homogenous layer 402 over the illumination wavelengths.

The plot 406b depicts the imaginary component of the dispersion parameters, also referred to as extinction coefficient (k). The plot 406b include plotline 408b and plotline 410b. The plotline 408b depicts the extinction coefficient (k) of the roughness layer 404 over the illumination wavelengths. The plotline 410b depicts the extinction coefficient (k) of the homogenous layer 402 over the illumination wavelengths.

In this example, the plotline 408a and the plotline 408b is for the roughness layer 404 having a mixture of 50% air and 50% silicon. The plotline 408a and the plotline 408b may be determined using the effective medium approximation (EMA) of the roughness layer 404. The plotline 410b and the plotline 410b is for the homogenous layer of silicon (Si). The plotline 410b and the plotline 410b may also be referred to the regular Si dielectric function or dispersion relationship of the homogenous layer 402.

Figure 5A:
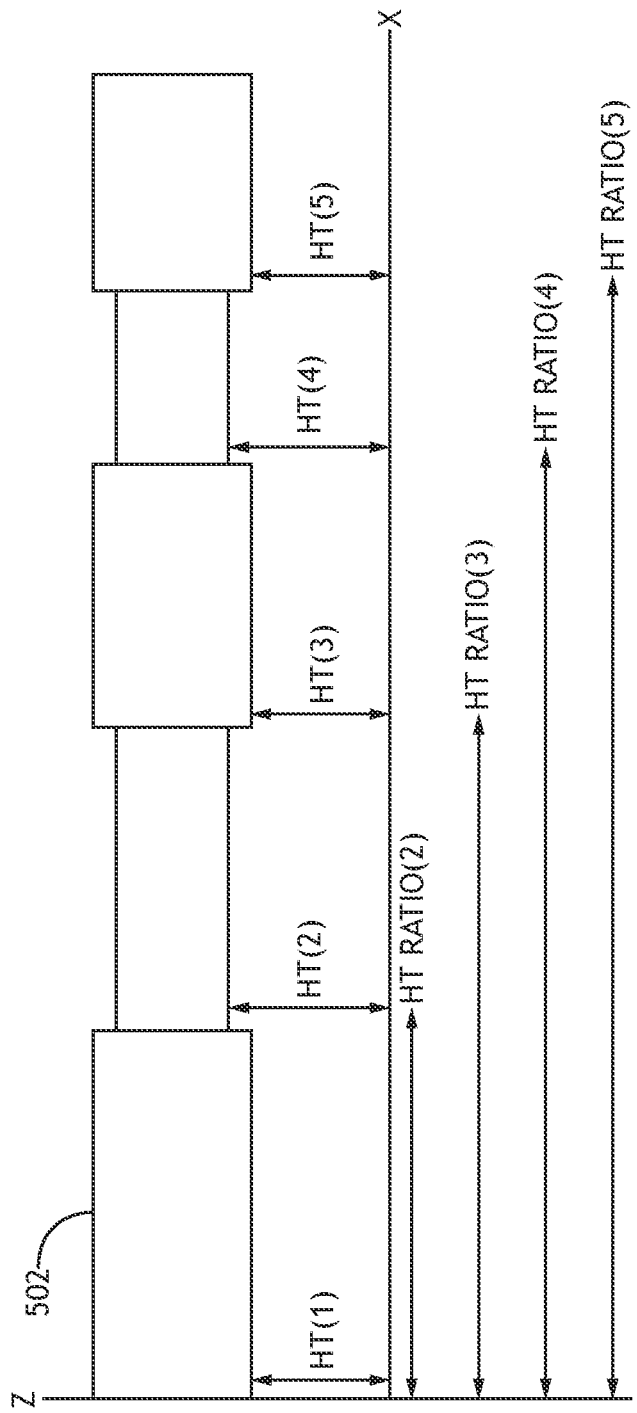
FIG. 5A depicts a building block including segments, in accordance with one or more embodiments of the present disclosure.
Figure 5B:
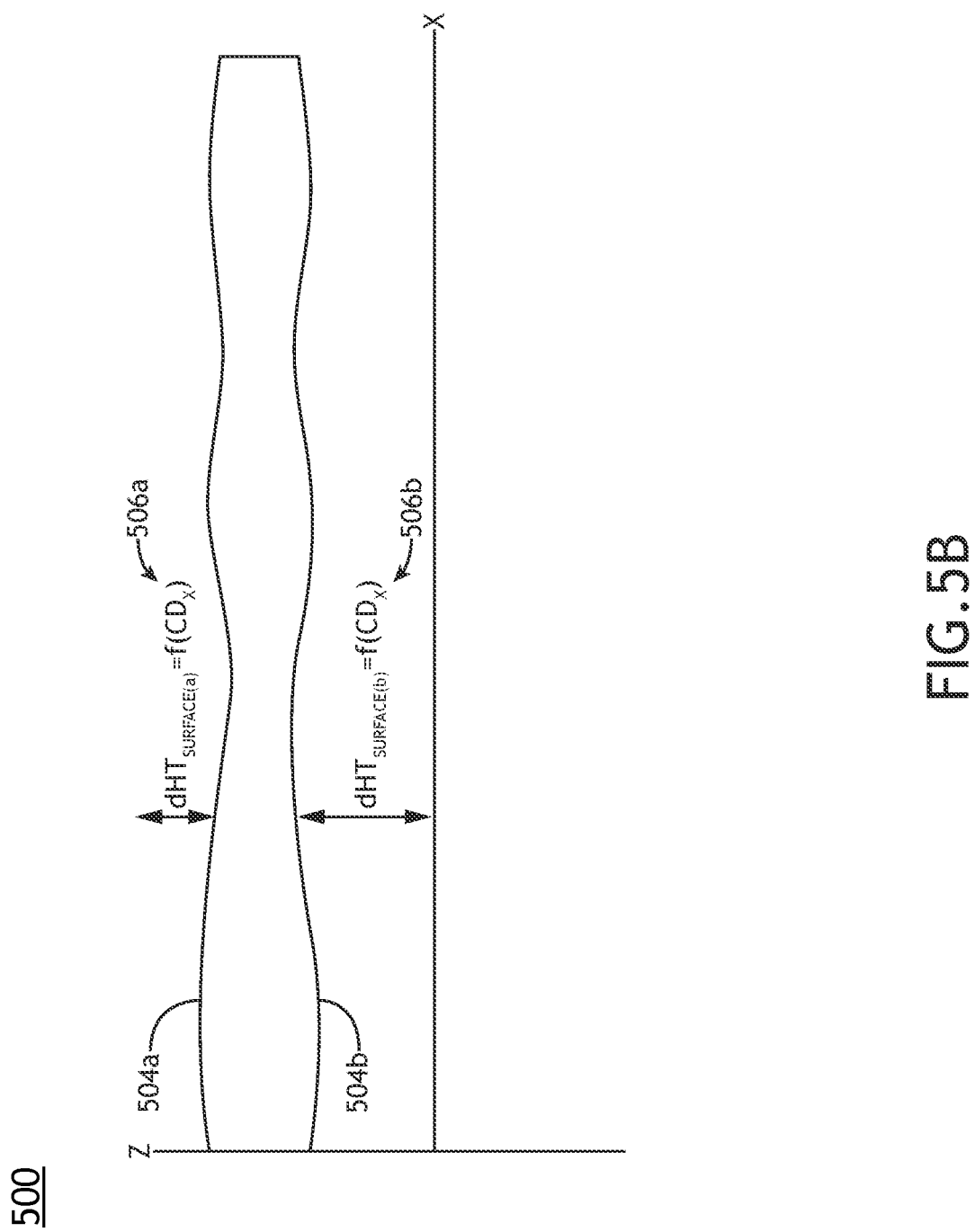
FIG. 5B depicts a building block including surfaces defined by polynomial functions, in accordance with one or more embodiments of the present disclosure.

Referring now to FIGS. 5A-5B, a building block 500 is described, in accordance with one or more embodiments of the present disclosure. The building block 500 is an example of the structural model 310 provided to the optical response function building module 312. The building block 500 is anisotropic and includes a height which varies along a direction. The building block 500 approximates the surface roughness of the nanosheet 202 profile by varying the height.

The building block 500 may also be referred to as a Surface Shape building block, a Flex Shape building block, a nanosheet building block, and the like. The building block 500 supports detailed surface profile control. The building block 500 can speed up the time to results and provide accurate data. The building block 500 is an RCWA-based approach to measure the nanosheet height along the channel. It is contemplated that the building block 500 provides modeling flexibility for applications such as GAA, Forksheet transistors, complementary field-effect transistors (CFET), and the like.

The building block 500 defines the nanosheet 202 using one or more parameters. The building block offers wide range of height shape flexibility and is fully defined by the values of the parameters. The parameters may be received as the user input 302 to the structural model building module 308. In some embodiments, the building block 500 may include a profile design modeled by segments 502 and/or polynomial functions 506. The parameters may include any parameters to define the segments and/or the polynomial functions 506.

Referring now in particular to FIG. 5A, the building block 500 includes segments 502. The parameters may include a quantity of the segments 502, a height HT(i) for each segment 502, and/or a height ratio HTRatio(i) for each segments 502. The height HT(i) and/or height ratio HTRatio (i) may be floated to design a building block profile approximating the nanosheet 202 profile. The quantity of the segments 502, a height HT(i) for each segment 502, and/or a height ratio HTRatio(i) for each segment 502 may be received as the user input 302. The height HT(i) may also be referred to as a segment height. The height ratio HTRatio(i) may also be referred to as a critical dimension along the direction. The segment height defined at the critical dimension along the direction.

The segments 502 may include a shape. It is contemplated that the segments 502 may include diamond-shaped primitive nanowire building block, elliptically-shaped primitive nanowire building block, triangular-shaped primitive nanowire building block, square-shaped primitive nanowire building block, trapezoidal-shaped primitive nanowire building block, cylindrically-shaped primitive nanowire building block, rectangular or slab-shaped primitive nanowire building block, hexagonal-shaped primitive nanowire building block, step-shaped primitive nanowire building block, elongated primitive nanowire building block, or any a combination thereof. As depicted, the segments 502 are slabs and the building block 500 includes a stepped-shape, although this is not intended to be limiting. Stair-case approximation is applied in each of the segments 502.

In some embodiments, the building block 500 supports a combination of multiple types of the shapes along the direction. In this regard, the segments 502 may include any combination of the diamond-shaped primitive nanowire building block, elliptically-shaped primitive nanowire building block, triangular-shaped primitive nanowire building block, square-shaped primitive nanowire building block, trapezoidal-shaped primitive nanowire building block, cylindrically-shaped primitive nanowire building block, rectangular or slab-shaped primitive nanowire building block, hexagonal-shaped primitive nanowire building block, step-shaped primitive nanowire building block, elongated primitive nanowire building block, and the like.

The junction point between the shapes may be specified in terms of one or more critical dimensions. The critical dimensions may include height HT(i) and/or height ratio HTRatio(i).

The height ratio HTRatio(i) for each segment 502 can be reported at a fixed width or percentage width. In some embodiments, the height ratio HTRatio(i) may be defined at a % of the nanosheet 202 critical dimension from an edge along the direction, also referred to as a percentage critical dimension from an edge. For example, the height ratio HTRatio(3) may be defined at 50% from the edge along the x-direction. In some embodiments, the height ratio HTRatio (i) may be defined at fixed position from the edge along the direction, also referred to as a fixed critical dimension from the edge. For example, the height ratio HTRatio(3) may be defined at 5 nm from the edge along the x-direction.

The height HT(i) for each segment 502 can be reported at a fixed height or percentage height. In some embodiments, the height HT(i) may be defined at a % of the nanosheet 202 height or thickness, also referred to as a percentage segment height. For example, the height ratio HT(3) may be defined as 100% of the nanosheet thickness. In some embodiments, the height ratio HT(i) may be defined at fixed height, also referred to as a fixed segment height. For example, the height HT(3) may be defined as 5 nm in thickness.

A resolution of the building block 500 may be adjusted by adjusting the quantity of the segments 502. For example, the resolution may be increased by increasing the quantity of the segments 502. If the computational resources can be afforded, the quantity of the segments and similarly the resolution may be increased. The increased resolution may enable the building block 500 to better matches the morphology of the nanosheet 202. As depicted, the building block includes a resolution with five of the segments 502, although this is not intended as a limitation of the present disclosure. It is contemplated that the building block may include resolutions of 20 segments, 50 segments, or more. The resolution is implemented to control the surface variation/horizontal slicing in the building block.

Referring now in particular to FIG. 5B, the building block 500 includes a defined by one or more polynomial functions 506. The building block 500 include surfaces 504. The polynomial functions 506 define the surfaces 504. The height of the surface may be defined as the delta height (dHT) as a function of the critical dimension (CD) along a direction. As depicted, the polynomial functions 506 are defined for the critical dimension in the x-direction ($CD_x$). It is further contemplated that the polynomial functions 506 may be defined for the critical dimension in the x-direction and/or the y-direction. In this regard, the delta height (dHT) may be defined as a polynomial function varying as function of the CD along x or y. It is contemplated that the polynomial functions 506 may include any polynomial function to account for all possible surface shapes of the nanosheet 202. The polynomial functions 506 for the surfaces 504 may be received as the user input 302.

The building block 500 includes a surface 504a and a surface 504b. The surface 504a is opposite to the surface 504b. The surface 504a is defined by a polynomial function 506a and the surface 504b is defined by a polynomial function 506b. The height of the building block 500 is defined by the polynomial function 506a and the polynomial function 506b. The polynomial function 506a may be the same and/or different than the polynomial function 506b. The user input 302 may include any polynomial function 506a for the surface 504a, then the same or different polynomial function 506b for the surface 504b. The polynomial functions 506 then define the nanosheet surface shape along the channel.

Referring generally again to FIGS. 5A-5B, the building block 500 is described. The building block 500 may thus be used as the geometric model 310 and approximates the surface roughness of the nanosheet 202 profile. The optical response function model 314 of the structure 200 of the sample 104 to the illumination 108 is generated based at least in part on the geometric model 310 (e.g., on the building block 500). The optical response function model 314 then simulates the optical response of the nanosheet 202 profile with the surface roughness to the illumination 108. For example, the optical response function model 314 performs RCWA on the building block 500 to generate synthetic spectra with pre-layer process variation mimicking real inline measurement performance. The advantage of using the building block 500 is that there is no need to approximate the surface roughness with an effective medium approximation. The optical response function model 314 is provided to generate the parametric sub-structure model 318 (e.g., machine learning model) based on at least the optical response function model 314.

The parametric sub-structure model 318 may enable the measurement of sheet specific roughness (e.g., roughness amplitude and a correlation length) and/or height along the nanosheet.

In some embodiments, the parameter of interest may be a surface roughness of the nanosheet 202. The surface roughness of the nanosheet 202 may be defined by the roughness amplitude ($\delta$) and correlation length ($\Gamma$). The roughness may be quantified through the standard deviation of the heights along the nanosheet. In this regard, the building block 500 provides a method of sheet specific roughness measurements using the building block 500.

An experiment using the building block 500 to determine nanosheet roughness is now described. A set of 450 synthetic spectra were generated while varying the underlaying parameters. The parameters were varied to mimic real inline measurement. The set of synthetic spectra were used to train the parametric sub-structure model 318. The parametric sub-structure model 318 was then validated with a blind test set of 50 spectra. The height standard deviation is varied between 0.5 and 2.6 nm for each nanosheet independently. The parametric sub-structure model 318 was determined to extract the nanosheet roughness $3\sigma$ from the blind test set to an accepted accuracy level of 0.97 R-squared. For example, the full Mueller matrix combined the appropriate model like the building block 500 is capable of experimentally tracking individual nanosheet roughness $3\sigma$ to an accuracy level of R-squared value between 0.9700 and 0.9819.

In some embodiments, the parameter of interest may be one or more heights along the nanosheet 202. The building block 500 enables the parametric sub-structure model 318 to report the height. The user input 302 may include the height at a position from the edge of the nanosheet 202. The parametric sub-structure model 318 may receive the measured data 304 and report the height at the position from the edge of the nanosheet 202 based on the measured data 304. The heights may be considered as parameters of interest. For example, the parametric sub-structure model 318 report the height 5 nm from the edge. In this regard, the building block 500 provides a method of sheet specific shape continuous profile measurement using the building block 500.

An experiment using the building block 500 to determine heights at five positions along the nanosheet 202 is now described. A set of 400 synthetic spectra were generated while varying the underlaying parameters. The parameters were varied to mimic real inline measurement. The set of synthetic spectra were used to train the parametric sub-structure model 318. The parametric sub-structure model 318 was then validated with a blind test set of 50 spectra. In some embodiments, the parametric sub-structure model 318 is able to track the heights of nanosheet with 5 nm in thickness with 0.5 nm accuracy. The parametric sub-structure model 318 was determined to extract the height from the blind test set to an accepted accuracy level of 0.90 R-squared. For example, the building block 500 was experimentally determined to include an R-squared value for heights at a first location with an R-square of 0.9083, an R-squared value for heights at a second location with an R-square of 0.9265, an R-squared value for heights at a third location with an R-square of 0.9376, an R-squared value for heights at a fourth location with an R-square of 0.9250, and an R-squared value for heights at a fifth location with an R-square of 0.9073.

Figure 6:
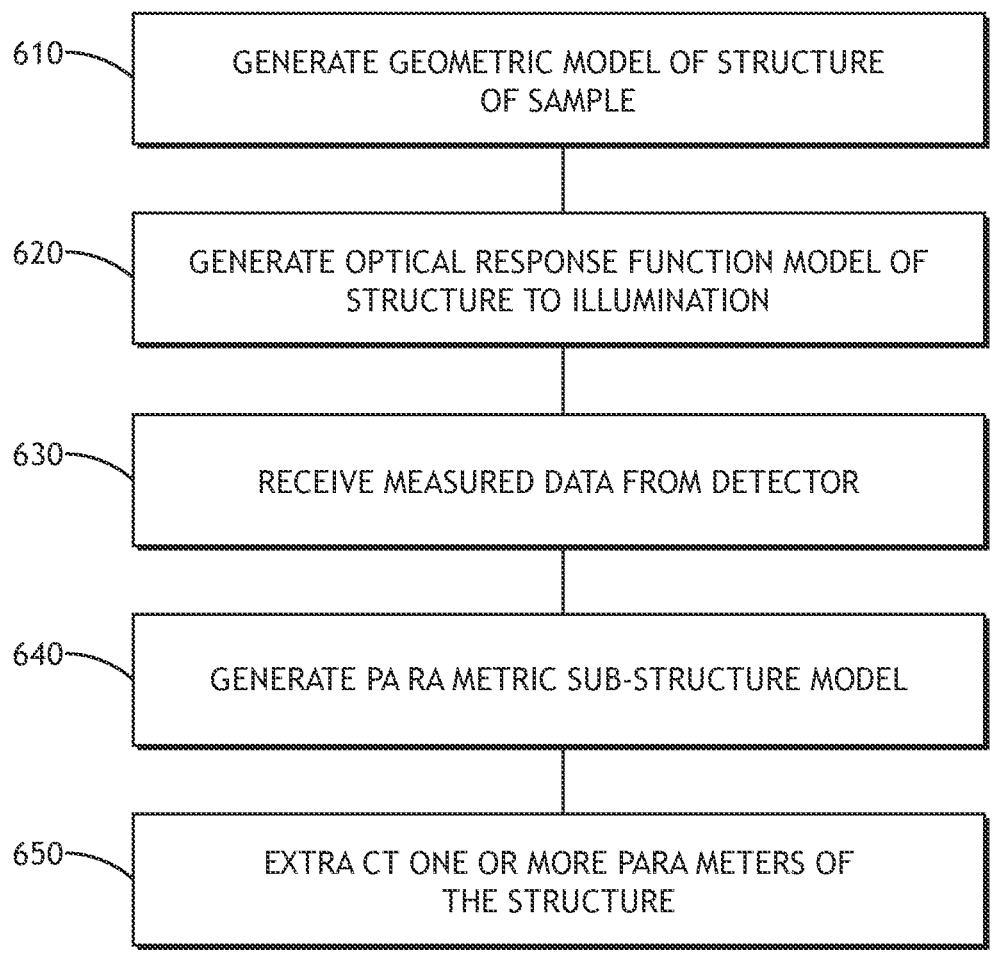
FIG. 6 depicts a flow diagram of a method, in accordance with one or more embodiments of the present disclosure.

FIG. 6 is a flow diagram illustrating steps performed in a method 600, in accordance with one or more embodiments of the present disclosure. The embodiments and enabling technologies described previously herein in the context of inspection system 100, EMA model profile 400, and building block 500 should be interpreted to extend to method 600. It is further noted, however, that the method 600 is not limited to the inspection system 100, EMA model profile 400, and building block 500.

In a step 610, a geometric model of a structure of a sample is generated. The structure includes a nanosheet profile with a surface roughness. The geometric model approximates the surface roughness of the nanosheet profile. In some embodiments, user input may be received from a user input source. The geometric model of the structure may be generated based at least in part on the user input.

In some embodiments, the geometric model approximates the surface roughness of the nanosheet profile by representing the nanosheet profile as a homogenous layer and a roughness layer. The roughness layer is a wrapper around the homogenous layer. The roughness layer is isotropic and the surface roughness is anisotropic. The homogenous layer includes a material. The homogenous layer includes one or more dispersion parameters associated with the material. The one or more dispersion parameters comprise a refractive index (n) and an extinction coefficient (k). Similarly, the roughness layer comprises one or more dispersion parameters determined using an effective medium approximation. The one or more dispersion parameters comprise a refractive index (n) and an extinction coefficient (k). The roughness layer is a mixture of first material and a second material in a ratio. The first material is different than the second material. The ratio is a fixed ratio and/or a floated ratio.

In some embodiments, the geometric model approximates the surface roughness of the nanosheet profile by a building block. A height of the building block varies along a direction.

In some embodiments, the height of the building block is defined by a plurality of segments. The plurality of segments each comprise a segment height at a critical dimension along the direction. The segment height may be defined as one of a fixed segment height or a percentage segment height. The critical dimension is defined as one of a fixed critical dimension or a percentage critical dimension from an edge. The plurality of segments may be slabs and the building block may include a stepped-shape. A resolution of the height of the building block is adjusted by adjusting a quantity of the plurality of segments.

In some embodiments, the height of the building block is defined by one or more polynomial functions. The nanosheet profile comprises a first surface and a second surface. The first surface is opposite to the second surface. The first surface is defined by a first polynomial function and the second surface is defined by a second polynomial function. The height of the building block is defined by the first polynomial function and the second polynomial function. The first polynomial function may or may not be different than the second polynomial function.

In a step 620, an optical response function model of the structure to illumination is generated based at least in part on the geometric model. The optical response function model simulates an optical response of the nanosheet profile with the surface roughness to the illumination. In some embodiments, the optical response function model is generated using a rigorous coupled wave analysis (RCWA).

In a step 630, measured data is received from a detector. The measured data includes a measured spectra of the structure detected by the detector.

In a step 640, a parametric sub-structure model is generated based on at least the optical response function model and the measured data. In some embodiments, the parametric sub-structure model is a neural network model trained using the optical response function model and the measured data.

In a step 650, one or more parameters of the structure are extracted based on the measured data. The one or more parameters may include a standard deviation of the surface roughness, a roughness amplitude, a correlation length, and/or a height profile at a plurality of locations along the direction.

Referring generally again to FIGS. 1A-6. Each of the steps of any of the various methods may be performed by one or more controllers (e.g., controller 124, and the like), which may be configured according to any of the embodiments described herein. In addition, the methods may be performed by any of the systems. The methods may also include one or more additional steps that may be performed by controller or any system embodiments described herein.

In some examples, metrology based on optical scatterometry involves determining the dimensions of the sample by the inverse solution of a pre-determined measurement model with the measured data. The inverse solution includes, but is not limited to, model-based regression, tomography, machine learning, or any combination thereof. In this manner, target profile parameters are estimated by solving for values of a parameterized measurement model that minimize errors between the measured optical intensities and modeled results.

As used throughout the present disclosure, the term "sample" generally refers to a substrate formed of a semiconductor or non-semiconductor material including one or more "layers" or "films," and patterned structures which are usually chosen to be periodic for optical metrology. For example, semiconductor or non-semiconductor materials include, but are not limited to, monocrystalline silicon, gallium arsenide, and indium phosphide. Layers formed on the substrate may include, but are not limited to, a resist, a dielectric material, a conductive material, or a semiconductive material. Many different types of sample layers are known in the art, and the term sample as used herein is intended to encompass a substrate and any types of layers formed thereon. Further, for the purposes of the present disclosure, the term sample and wafer should be interpreted as interchangeable. In addition, for the purposes of the present disclosure, the terms patterning device, mask and reticle should be interpreted as interchangeable.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random-access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An inspection system comprising:
 a controller comprising:
  a memory maintaining program instructions; and
  one or more processors configured to execute the program instructions causing the one or more processors to:

generate a geometric model of a structure of a sample; wherein the structure comprises a nanosheet profile with a surface roughness; wherein the geometric model approximates the surface roughness;

generate an optical response function model of the structure of the sample to illumination based at least in part on the geometric model; wherein the optical response function model simulates an optical response of the nanosheet profile with the surface roughness to the illumination;

receive measured data from a detector; wherein the measured data comprises a measured spectra of the structure detected by the detector;

generate a parametric sub-structure model based on at least the optical response function model and the measured data; and extract one or more parameters of the structure based on the measured data.

2. The inspection system of claim 1, wherein the geometric model approximates the surface roughness of the nanosheet profile by representing the nanosheet profile as a homogenous layer and a roughness layer; wherein the roughness layer is a wrapper around the homogenous layer.

3. The inspection system of claim 2, wherein the one or more parameters comprise a standard deviation of the surface roughness.

4. The inspection system of claim 2, wherein the homogenous layer comprises a material; wherein the homogenous layer comprises one or more dispersion parameters associated with the material; wherein the one or more dispersion parameters comprise a refractive index (n) and an extinction coefficient (k).

5. The inspection system of claim 2, wherein the roughness layer comprises one or more dispersion parameters determined using an effective medium approximation; wherein the one or more dispersion parameters comprise a refractive index (n) and an extinction coefficient (k).

6. The inspection system of claim 5, wherein the roughness layer is a mixture of first material and a second material in a ratio; wherein the first material is different than the second material.

7. The inspection system of claim 6, wherein the ratio is a fixed ratio.

8. The inspection system of claim 6, wherein the program instructions cause the one or more processors to float the ratio.

9. The inspection system of claim 5, wherein the roughness layer is isotropic; wherein the surface roughness is anisotropic.

10. The inspection system of claim 1, wherein the geometric model approximates the surface roughness by a building block; wherein a height of the building block varies along a direction.

11. The inspection system of claim 10, wherein the height of the building block is defined by a plurality of segments.

12. The inspection system of claim 11, wherein the plurality of segments each comprise a segment height at a critical dimension along the direction.

13. The inspection system of claim 12, wherein the segment height is defined as one of a fixed segment height or a percentage segment height.

14. The inspection system of claim 12, wherein the critical dimension is defined as one of a fixed critical dimension or a percentage critical dimension from an edge.

15. The inspection system of claim 11, wherein the plurality of segments are slabs; wherein the building block comprises a stepped-shape.

16. The inspection system of claim 11, wherein the program instructions cause the one or more processors to adjust a resolution of the height of the building block by adjusting a quantity of the plurality of segments.

17. The inspection system of claim 10, wherein the height of the building block is defined by one or more polynomial functions.

18. The inspection system of claim 17, wherein the nanosheet profile comprises a first surface and a second surface; wherein the first surface is opposite to the second surface; wherein the first surface is defined by a first polynomial function; wherein the second surface is defined by a second polynomial function; wherein the height of the building block is defined by the first polynomial function and the second polynomial function.

19. The inspection system of claim 18, wherein the first polynomial function is different than the second polynomial function.

20. The inspection system of claim 10, wherein the one or more parameters comprise a roughness amplitude and a correlation length.

21. The inspection system of claim 10, wherein the one or more parameters comprise a height profile at a plurality of locations along the direction.

22. The inspection system of claim 1, comprising a user input source; wherein the program instructions cause the one or more processors to receive user input from the user input source; wherein the one or more processors generate the geometric model based at least in part on the user input.

23. The inspection system of claim 1, comprising an optical imaging sub-system; wherein the optical imaging sub-system comprises an illumination source and the detector; wherein the illumination source generates the illumination; wherein the detector is communicatively coupled to the controller.

24. The inspection system of claim 23, wherein the optical imaging sub-system comprises at least one of a spectroscopic ellipsometer, a reflectometer, a small-angle x-ray scatterometer, a scanning electron microscope, or a transmission electron microscope.

25. The inspection system of claim 1, wherein the nanosheet profile comprises at least one of a diamond cross-section, an elliptical cross-section, a triangular cross-section, a rectangular cross-section, or a trapezoidal cross-section.

26. The inspection system of claim 1, wherein the structure is a gate-all-around (GAA) transistor.

27. The inspection system of claim 1, wherein the nanosheet profile comprises a thickness of 5 nanometers or below.

28. The inspection system of claim 1, wherein the program instructions cause the one or more processors to generate the optical response function model using a rigorous coupled wave analysis (RCWA).

29. The inspection system of claim 1, wherein the parametric sub-structure model is a neural network model trained using the optical response function model and the measured data.

30. A method comprising:
generating a geometric model of a structure of a sample; wherein the structure comprises a nanosheet profile with a surface roughness; wherein the geometric model approximates the surface roughness;

generating an optical response function model of the structure of the sample to illumination based at least in part on the geometric model; wherein the optical response function model simulates an optical response of the nanosheet profile with the surface roughness to the illumination;

receiving measured data from a detector; wherein the measured data comprises a measured spectra of the structure detected by the detector;

generating a parametric sub-structure model based on at least the optical response function model and the measured data; and extracting one or more parameters of the structure based on the measured data.

31. The method of claim 30, wherein the geometric model approximates the surface roughness by representing the nanosheet profile as a homogenous layer and a roughness layer; wherein the roughness layer is a wrapper around the homogenous layer.

32. The method of claim 31, wherein the roughness layer comprises one or more dispersion parameters determined using an effective medium approximation; wherein the one or more dispersion parameters comprise a refractive index (n) and an extinction coefficient (k).

33. The method of claim 32, wherein the roughness layer is a mixture of first material and a second material in a ratio; wherein the first material is different than the second material.

34. The method of claim 32, wherein the roughness layer is isotropic; wherein the surface roughness is anisotropic.

35. The method of claim 30, wherein the geometric model approximates the surface roughness by a building block; wherein a height of the building block varies along a direction.

36. The method of claim 35, wherein the height of the building block is defined by a plurality of segments; wherein the plurality of segments each comprise a segment height at a critical dimension along the direction.

37. The method of claim 36, wherein the segment height is defined as one of a fixed segment height or a percentage segment height; wherein the critical dimension is defined as one of a fixed critical dimension or a percentage critical dimension from an edge.

38. The method of claim 35, wherein the height of the building block is defined by one or more polynomial functions.

39. The method of claim 38, wherein the nanosheet profile comprises a first surface and a second surface; wherein the first surface is opposite to the second surface; wherein the first surface is defined by a first polynomial function; wherein the second surface is defined by a second polynomial function; wherein the height of the building block is defined by the first polynomial function and the second polynomial function.

40. The method of claim 30, wherein the one or more parameters comprise at least one of standard deviation of the surface roughness, a roughness amplitude and a correlation length, a height profile.

* * * * *